(12) United States Patent
Jones, Jr. et al.

(10) Patent No.: US 10,946,807 B2
(45) Date of Patent: Mar. 16, 2021

(54) UNIVERSAL MOUNTING SYSTEM FOR TABLET-CONTROLLED STEREO HEAD UNIT

(71) Applicants: William H. Jones, Jr., Holly Hill, FL (US); Anthony Fiore, Holly Hill, FL (US)

(72) Inventors: William H. Jones, Jr., Holly Hill, FL (US); Anthony Fiore, Holly Hill, FL (US)

(73) Assignee: Metra Electronics Corporation, Holly Hill, FL (US)

( * ) Notice: Subject to any disclaimer, the term of this patent is extended or adjusted under 35 U.S.C. 154(b) by 0 days.

(21) Appl. No.: 16/774,013

(22) Filed: Jan. 28, 2020

(65) Prior Publication Data

US 2020/0156557 A1  May 21, 2020

Related U.S. Application Data

(63) Continuation-in-part of application No. 14/814,078, filed on Jul. 30, 2015, now Pat. No. 10,579,232.

(51) Int. Cl.
| | |
|---|---|
| *G06F 1/16* | (2006.01) |
| *B60R 11/02* | (2006.01) |
| *B60R 11/00* | (2006.01) |
| *H05K 5/02* | (2006.01) |

(52) U.S. Cl.
CPC .......... *B60R 11/0217* (2013.01); *B60R 11/00* (2013.01); *G06F 1/1626* (2013.01); *H05K 5/0204* (2013.01); *B60R 2011/0005* (2013.01)

(58) Field of Classification Search
CPC ..................................................... G06F 1/1626
See application file for complete search history.

(56) References Cited

U.S. PATENT DOCUMENTS

2020/0156557 A1*  5/2020  Jones, Jr. ............. H05K 5/0204

OTHER PUBLICATIONS

Nexus 7—2013.*
Android—2012.*

* cited by examiner

*Primary Examiner* — Dave E Choi
(74) *Attorney, Agent, or Firm* — J. Wiley Horton

(57) ABSTRACT

A hardware system and method for mounting a tablet computing device in a vehicle dash. The invention makes use of an inventory of prior art mounting kits that are configured to mount standardized aftermarket stereo head units in a vehicle dash while smoothly blending the aftermarket head unit into the surrounding dash to create a finished appearance.

20 Claims, 20 Drawing Sheets

UNIVERSAL MOUNTING SYSTEM FOR TABLET-CONTROLLED STEREO HEAD UNIT

CROSS-REFERENCES TO RELATED APPLICATIONS

This non-provisional patent application is a continuation-in-part of U.S. patent application Ser. No. 14/814,078. The parent application listed the same inventors.

STATEMENT REGARDING FEDERALLY SPONSORED RESEARCH OR DEVELOPMENT

Not Applicable.

MICROFICHE APPENDIX

Not Applicable

BACKGROUND OF THE INVENTION

1. Field of the Invention

This invention relates to the field of motor vehicles. More specifically, the invention comprises a system and method for mounting a tablet-controlled stereo head unit in a variety of vehicle dash assemblies.

2. Description of the Related Art

Most motor vehicles now incorporate a stereo head unit as standard equipment. The term "head unit" is used within the industry to refer to an audio entertainment system that may incorporate a wide variety of features. These features include an AM/FM receiver, a power amplifier, a CD player, an auxiliary interface for communicating with a smart phone, and a satellite receiver. More advanced examples include a navigation system presented on a display screen. Features not traditionally associated with audio entertainment may be includes as well.

Original equipment manufacturers ("OEM's") do not standardize the physical shape and size of their OEM stereo head units. FIG. 1 provides an example of an OEM stereo head unit incorporated into a stylized dash assembly in a sedan. OEM head unit 32 occupies a prominent position in center bezel 14 of dash assembly 10.

Many other familiar components are shown in FIG. 1. Steering wheel 26 is shown in the left hand drive position. Instrument cluster 30 is provided forward of the steering wheel. Instrument shroud 28 limits glare on the instrument cluster. Central column 22 lies below the OEM head unit. Left knee bolster 24 lies to the left of the central column and right knee bolster 20 lies to its right. Environmental panel 34—which incorporates fan and temperature controls—lies just below OEM head unit 32. Glove box 18 is located in right knee bolster 20.

The area surrounding the OEM head unit includes several different components that are assembled together to provide a smooth and stylized presentation to the driver. These include lower bezel 16, center bezel 14, and upper bezel 12. In this particular vehicle, central vents 38 are located in upper bezel 12.

OEM head unit opening 36 is provided in the center bezel to accommodate the OEM head unit. The reader will note that the opening is an irregular shape (roughly trapezoidal). The dimensions of the opening are set by the OEM. They are designed to accept the OEM head unit and no provision is made for the substitution of head units from other manufacturers. In fact, OEM's often create a "customized" shape for the OEM head units so that the substitution of aftermarket head units is difficult. OEM head units are a significant profit center in the sale of new cars. As an example, a buyer desiring an integrated navigation system must often pay 3,000 U.S. Dollars or more for the inclusion of this functionality in the OEM head unit. On the other hand, aftermarket navigation system of equal or better functionality are available for less than 1/3 of the cost (and are often easier to upgrade).

The present inventors have previously created numerous kits that are used to mount an aftermarket stereo head unit in the place of an OEM head unit. These kits are used in the present invention, and so an understanding of these kits is beneficial to the reader's understanding of the present invention.

In order to install an aftermarket head unit in the dash assembly of FIG. 1, the dash assembly must be disassembled to some extent. FIG. 2 illustrates a portion of this process. The disassembly process varies greatly for different vehicles, so this should be viewed as illustrative only. Glove box 18 is removed from glove box opening 42. Side vent 40 is removed from its attachment points as well. The removal of these items provides access to the lower right mounting fasteners for center bezel 14. A portion of left knee bolster 24 is removed—or pried sufficiently out of the way—to provide access to the lower left mounting fasteners for the center bezel. These mounting fasteners are then released so that center bezel 14 can be lifted upward and rearward as shown. With the center bezel lifted free, the user can more easily discern the shape of OEM head unit opening 36—which is the opening configured to "frame" the OEM head unit.

FIG. 3 provides a detailed view of OEM head unit 32 with the center bezel completely removed. OEM stereo bezel 54 incorporates various user controls. It also incorporates a pair of upper tabs 46 and a pair of lateral tabs 50. Two screws 48 are passed through holes or slots in the upper tabs 46 and into dash mounting frame 44. Likewise, screws 52 are passed through lateral tabs 50 and into dash mounting frame 44 (only a single screw and single lateral tab are visible in the view). Screws 42, 48 are removed in order to remove the OEM head unit 32. Once it is pulled free of the dash its electrical connections are accessible and these may be unplugged to complete the removal process.

A problem exists, however. In FIG. 3, the reader will note that shape of the OEM head unit. Aftermarket head units are provided with a different form factor. Most aftermarket units are now provided in a "single DIN" or "double DIN" form factor. "DIN" refers to the German Institute for Standardization (Deutsches Institut fur Normung). The International Standards Organization ("ISO") adopted the original DIN standard as ISO 7736. However, most users still refer to the standards as "DIN." A "single DIN" head unit has a face plate size of 180 mm by 50 mm. A "double DIN" head unit has a face plate size of 180 by 100.3 mm. No depth specification is provided and the aftermarket units have a range of depths.

FIG. 4 shows a mounting kit 56 that is specifically configured to mount a double DIN aftermarket head unit to the dash mounting frame 44 shown in FIG. 3. The reader should note that single DIN mounting kits have also been created by the present inventors. A double DIN kit is used for purposes of illustration but it should not be viewed as limiting. The present invention will work with a single DIN kit as well.

The mounting kit in FIG. 4 includes a pair of attachment brackets. Right attachment bracket 58 is configured to attach to the right side of a double DIN aftermarket head unit (with the right side being designated from the vantage point of a user looking at the front panel of the aftermarket head unit). Left attachment bracket 60 is configured to attach to the left side of the head unit. Each attachment bracket includes an upper tab 68 and a lateral tab 70. The upper tabs 68 include a pair of slots 71. The lateral tabs include a pair of slots 72.

Bezel 62 includes an exterior trapezoidal shape that is intended to integrate with the trapezoidal opening in the OEM dash. However, the central portion of bezel 62 includes standard opening 64—which conforms to the double DIN standard of 180 by 100.3 mm. The bezel also includes other features configured to allow its attachment to the dash mounting frame or the center bezel, as appropriate. In the example shown several tangs 74 are provided with associated mounting clips 76. Hook tabs 78 are also provided. These features correspond to engaging features on center bezel 14 of the vehicle.

A hole/slot array 66 is provided in each of the two attachment brackets. The hole/slot array is configured to accommodate a wide range of mounting holes provided on the sides of different brands of aftermarket head units. The provision of a well-designed hole/slot array allows a single attachment bracket design to attach to all the most popular aftermarket head units. It is also possible to provide multiple attachment bracket designs to accommodate the various aftermarket head units, but this increases tooling costs.

FIG. 5 shows an exemplary aftermarket double DIN head unit 80 with right attachment bracket 58 and left attachment bracket 60 in position for installation. Screws 82 are passed through appropriate holes/slots in the attachment brackets and threaded into threaded receiving holes 84 in the aftermarket head unit. The screws are then tightened to secure the attachment brackets to the head unit. Returning to FIG. 4, the reader should note that in some instances bezel 62 will be secured to the aftermarket head unit and/or attachment brackets. In other instances bezel 62 will be attached to the vehicle's center bezel 14. In still other instances bezel 62 will be secured by "sandwiching" it between other components. The actual method of securing bezel 62 is not significant to the present invention.

FIG. 6 shows the aftermarket head unit installed in the same location as the OEM head unit depicted in FIG. 4. The reader will observe how upper tabs 68 on the left and right attachment brackets fall in the proper position. Lateral tabs 70 likewise fall in the proper position. Screws 48, 52 are then used to secure the left and right attachment bracket to dash mounting frame 44 (and thus secure double DIN head unit 80 to the dash). The electrical connections to the aftermarket head unit are typically made before it is pushed into its final position and secured.

The reader will observe how bezel 62 includes standard opening 64 (in this case an opening meeting the double DIN standard). This standard opening neatly "frames" double DIN head unit 80. However, bezel 62 also includes a trapezoidal outer perimeter designed to tightly fit within OEM head unit opening 36 (see FIG. 2) in center bezel 14. Looking again at FIG. 6, the OEM dash components are reinstalled around the mounted double DIN head unit. The result is a nicely finished appearance with the double DIN aftermarket head unit having been substituted for the OEM head unit.

The present inventors have created many prior kits that facilitate the mounting of a standardized single DIN or double DIN aftermarket head unit into a vehicle dash assembly. Examples of these prior kits are disclosed in U.S. Pat. Nos. D728555, D719560, D740270, and D727888. These prior design patents are hereby incorporated by reference. Looking at the kit shown in FIG. 4, some standardized definitions will be presented. The portion of each mounting bracket incorporating hole/slot array 66 will be referred to as the "head unit attachment portion." In the example shown this is a flat plate. However, a different shape may be needed if a head unit is provided with a non-planar side. The portions or portions of each attachment bracket that are configured to be connected to the OEM dash components will be referred to as the "dash mounting features." In the example shown, these are upper and lateral tabs 68, 70 incorporating screw slots. Hook tab 78 is another example of a "dash mounting feature." The dash mounting features on each attachment bracket will vary depending on the nature of the OEM dash. These will include:
1. Curved tabs;
2. Tangs with spring-clip metal fasteners;
3. Tangs with snaps;
4. An engagement lip configured to slip into a channel in the OEM center dash; and
5. Sliding engagements.

The prior art kits developed by the present inventors include a wide variety of dash mounting features on the attachment brackets. Recently, however, an entirely new type of aftermarket head unit has been developed. An example of this type of head unit is described in detail in the parent application of the present invention U.S. patent application Ser. No. 14/814,078. Another example of this new type of unit is shown in FIG. 7. The components of FIG. 7 are described in this "BACKGROUND" section because they are already in existence. However, they are not presently known in the market as they are still in a developmental stage.

Split head unit 86 breaks with the traditional approach to providing an OEM or aftermarket head unit. The prior art units have the amplifier, the control electronics, and the touch-based user controls all in one housing. In split head unit 86, the amplifier and control electronics are housed within electronics housing 88. The same housing 88 contains many of the other components that would typically be contained within a single DIN or double DIN head unit. However, unlike the prior art, electronics housing 88 in FIG. 7 has no touch-based user controls (wireless controls such as BLUETOOTH may be included). Instead, all the touch-based user controls are provided by separate table 90. Tablet 90 is an integrated device containing a processor running software. Display and input functions are provided by touch screen 92. Tablet 90 is similar in functionality to familiar tablet devices such as the IPAD (marked by Apple, Inc. of Cupertino, Calif., USA) and the FIRE (marketed by Amazon.com, Inc. of Seattle, Wash., USA).

In the version shown table 90 is connected to electronics module 88 by tablet interface cable 98. Tablet connector 100 plugs into a jack on the back of tablet 90 (not visible in FIG. 7). In other embodiments the connection between the components can be made wirelessly.

Antenna connector 96 is configured to connect to an external antenna in order to provide better signal gain for the radio receiver within electronics enclosure 88. External device connector 102 connects the housing to external speakers, amplifiers, and other components. More than one such connector 102 can be provided. Mounting holes 94 are provided on the housing 88 to facilitate the attachment of the housing in a convenient location.

Electronics housing 88 can be mounted in a remote location, such as behind the dash. It can also be mounted in a center console, behind a kick panel, or even in a vehicle's trunk. Since it includes no touch-based user controls, there is no need to provide easy user access to the housing 88. Tablet 90 can be mounted using a variety of tablet-mounting pedestals and stalks, such as the RAM MOUNT series (marketed by National Products, Inc., of Seattle, Wash., USA). The tablet will typically be mounted in a position that is easy for the driver to reach—such as adjacent to a center console.

Systems such as shown in FIG. 7 are typically installed by professional aftermarket installation shops. The functionality of the split head unit 86 is desirable, but its mounting is unconventional. The service technician must select and install a mount for both the electronics housing 88 and table 90. Depending on the vehicle in question, this can be a challenge. The present invention provides a solution for this and other issues.

BRIEF SUMMARY OF THE PRESENT INVENTION

The present invention comprises a hardware system and method for mounting a tablet computing device in a vehicle dash. The invention makes use of an inventory of prior art mounting kits that are configured to mount standardized aftermarket stereo head units in a vehicle dash while smoothly blending the aftermarket head unit into the surrounding dash to create a finished appearance. A head unit emulator bracket is provided. One or more attachment brackets are secured to the head unit emulator bracket. The attachment brackets include dash mounting features that allow these brackets to be secured to the vehicle dash. The attachment brackets preferably also include features that allow an electronics housing to be secured to these brackets.

The head unit emulator bracket may include an integrally formed standoff or standoffs. Optionally, the standoff or standoffs can be provided as separate pieces. A tablet receiver is configured to attach to the standoffs. A capture bezel is preferably provided to attach to the tablet receiver and thereby secure a tablet to the tablet receiver. While the invention can be configured for mounting any tablet computing device, it is particularly suited to mount tablets that are part of a "split head unit" in which the electronics are contained within an electronics housing and the user interface is provided by a separate tablet.

Figure 1:
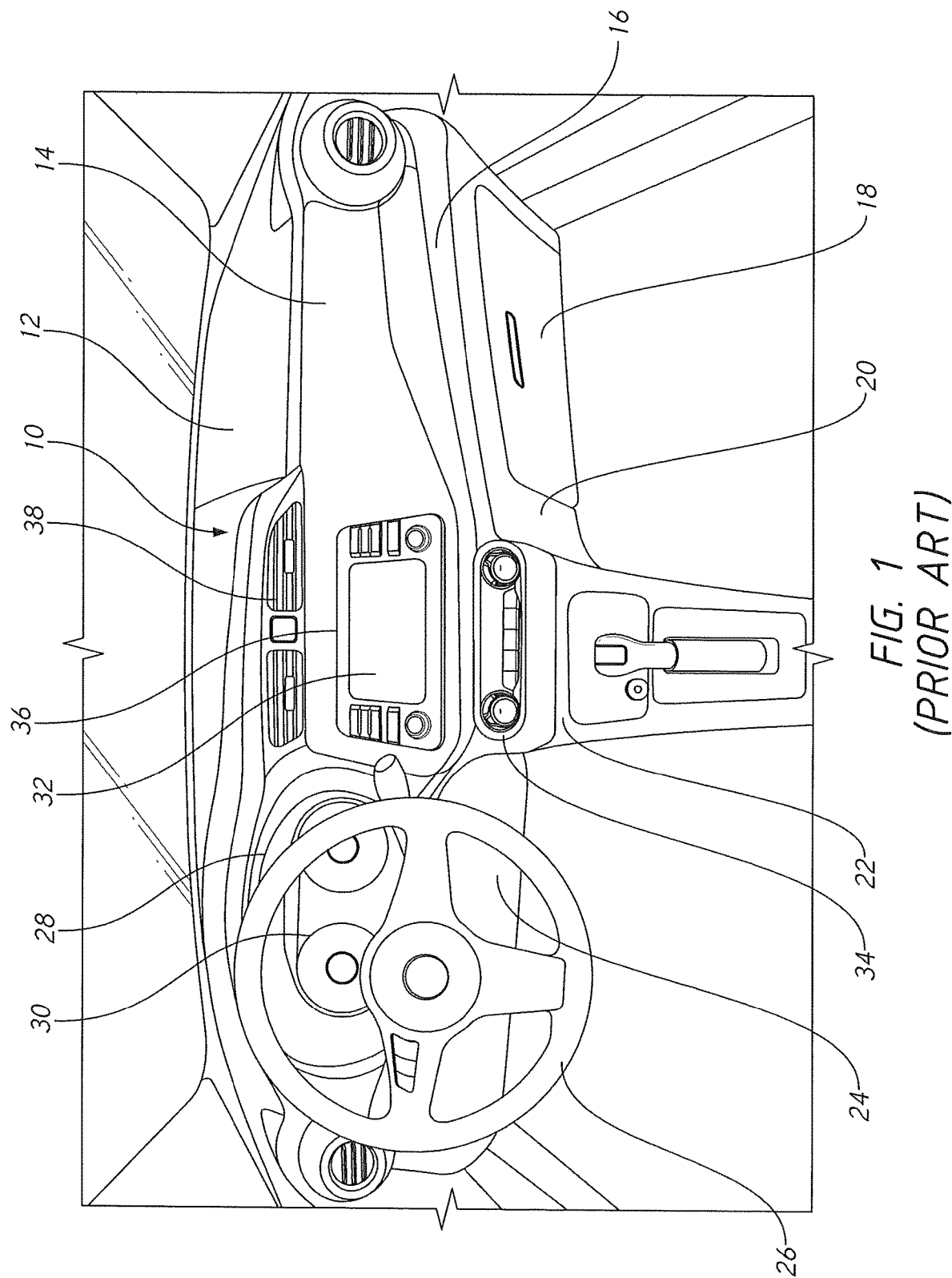
FIG. 1 is a perspective view, showing a prior art OEM stereo/NAV system installed in a prior art vehicle dash assembly.
Figure 2:
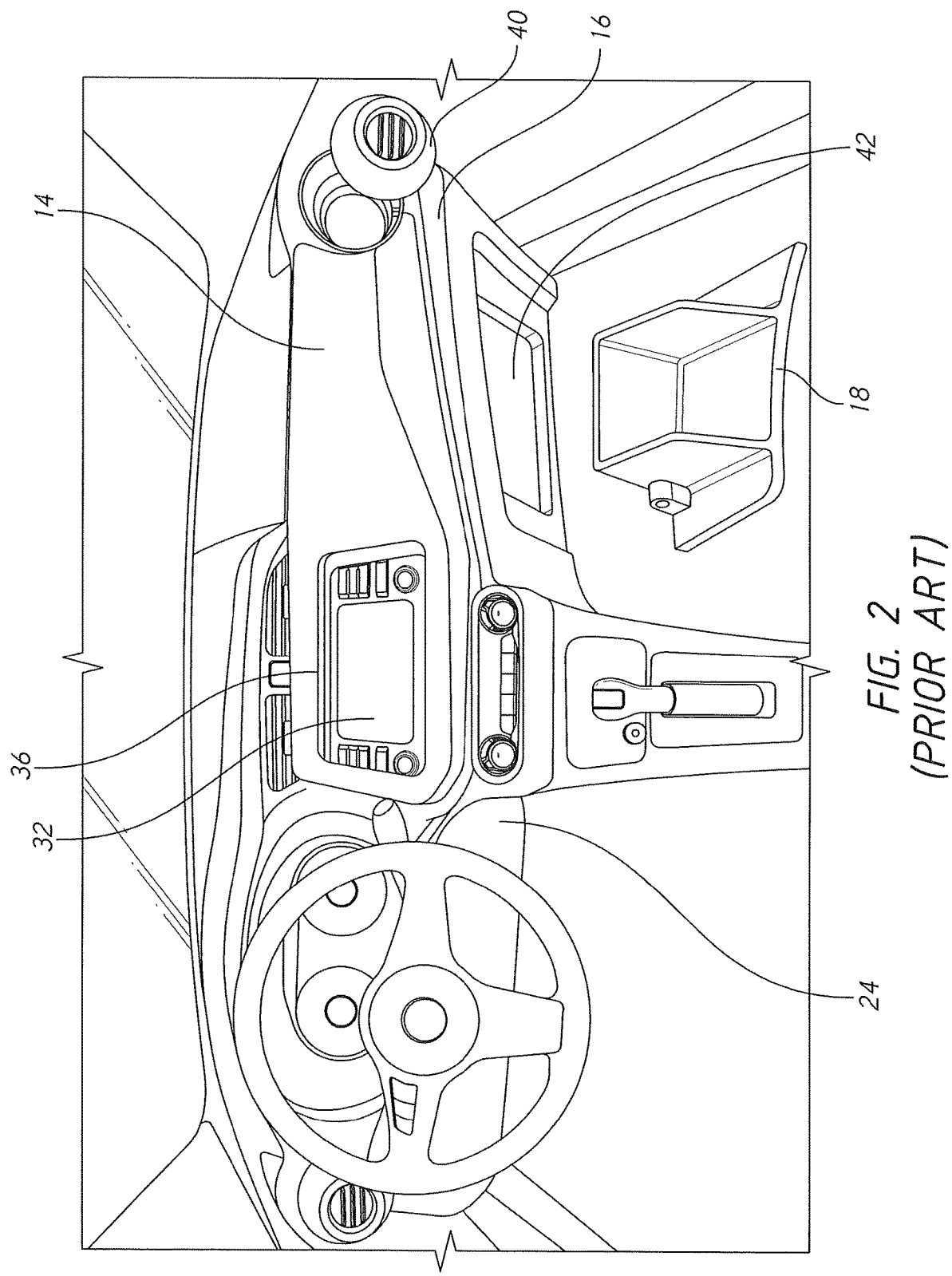
FIG. 2 is a perspective view, showing the disassembly of the prior art dash assembly.
Figure 3:
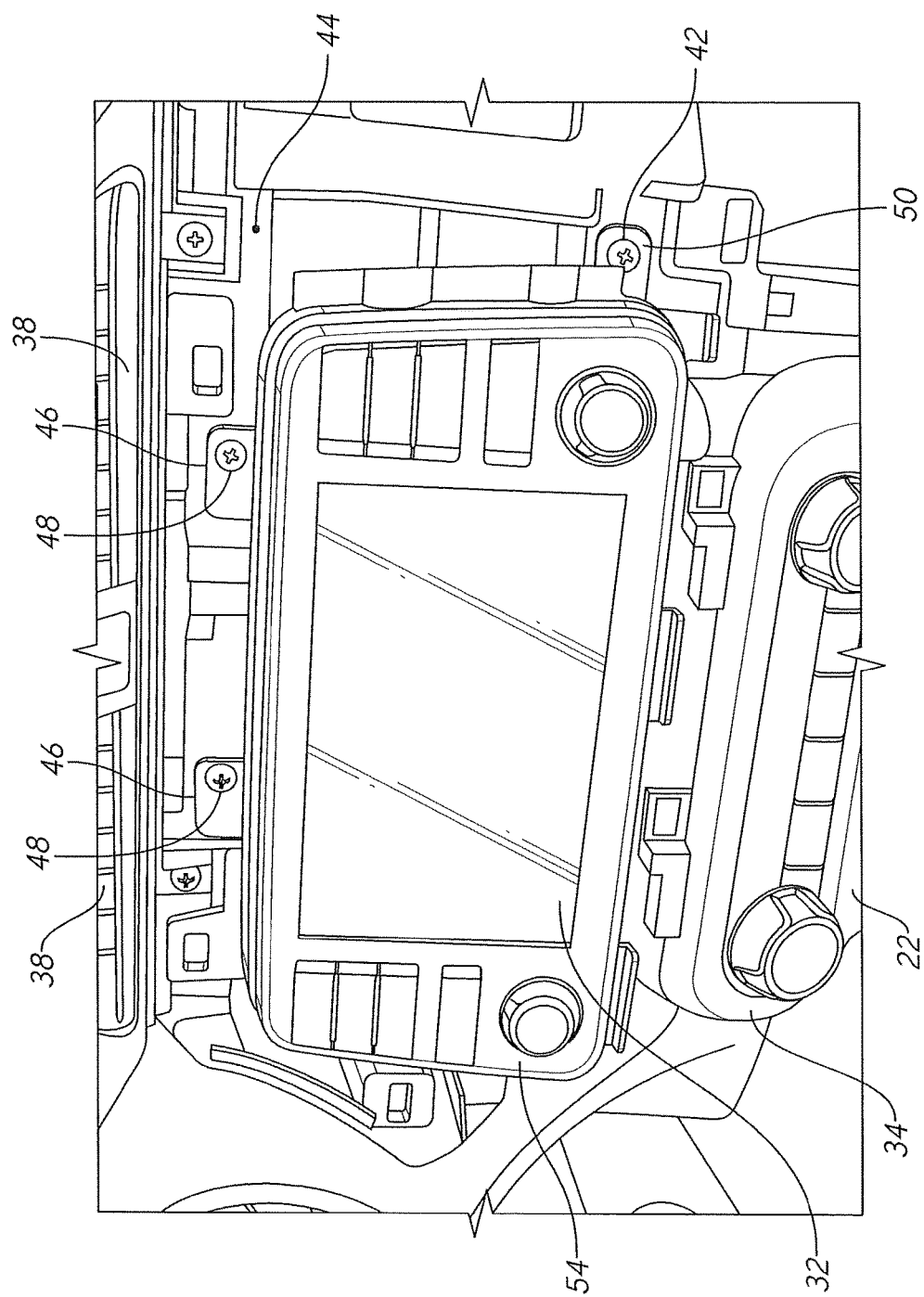
FIG. 3 is a detailed perspective view, showing the prior art stereo/NAV system after the dash assembly has been removed.

REFERENCE NUMERALS IN THE DRAWINGS 10 dash assembly
12 upper bezel
14 center bezel
16 lower bezel
18 glove box
20 right knee bolster
22 central column
24 left knee bolster
26 steering wheel
28 instrument shroud
30 instrument cluster
32 OEM stereo/NAV head unit
34 environmental panel
36 OEM head unit opening
38 central vent
40 side vent
42 glove box opening
44 dash mounting flange
46 upper tab
48 screw
50 lateral tab
52 screw
54 OEM stereo bezel
56 mounting kit
57 mounting kit 58 right attachment bracket
59 right attachment bracket
60 left attachment bracket
61 left attachment bracket
62 bezel
63 bezel
64 standard opening
66 hole/slot array
68 upper tab
70 lateral tab
71 slot
72 slot
74 tang
76 clip
78 hook tab
80 double DIN head unit
82 screw
84 hole
86 split head unit
88 electronics housing
90 tablet
92 touch screen
94 mounting hole
96 antenna connector
98 tablet interface unit
100 tablet connector
102 external device connector
104 split head unit mounting system
106 head unit emulator bracket.
107 perimeter
108 right tang
110 left tang
112 opening
114 opening
116 pocket
118 hole
120 standoff
121 standoff
122 T-protrusion
124 surface
125 recess
126 T-protrusion receiver
127 surface
128 tablet receiver
130 capture bezel
132 snap tang
134 protrusion
135 side wall
136 plate
137 plate
138 perimeter
140 overhang
142 screw
144 screw

DETAILED DESCRIPTION OF THE INVENTION

Figure 8:
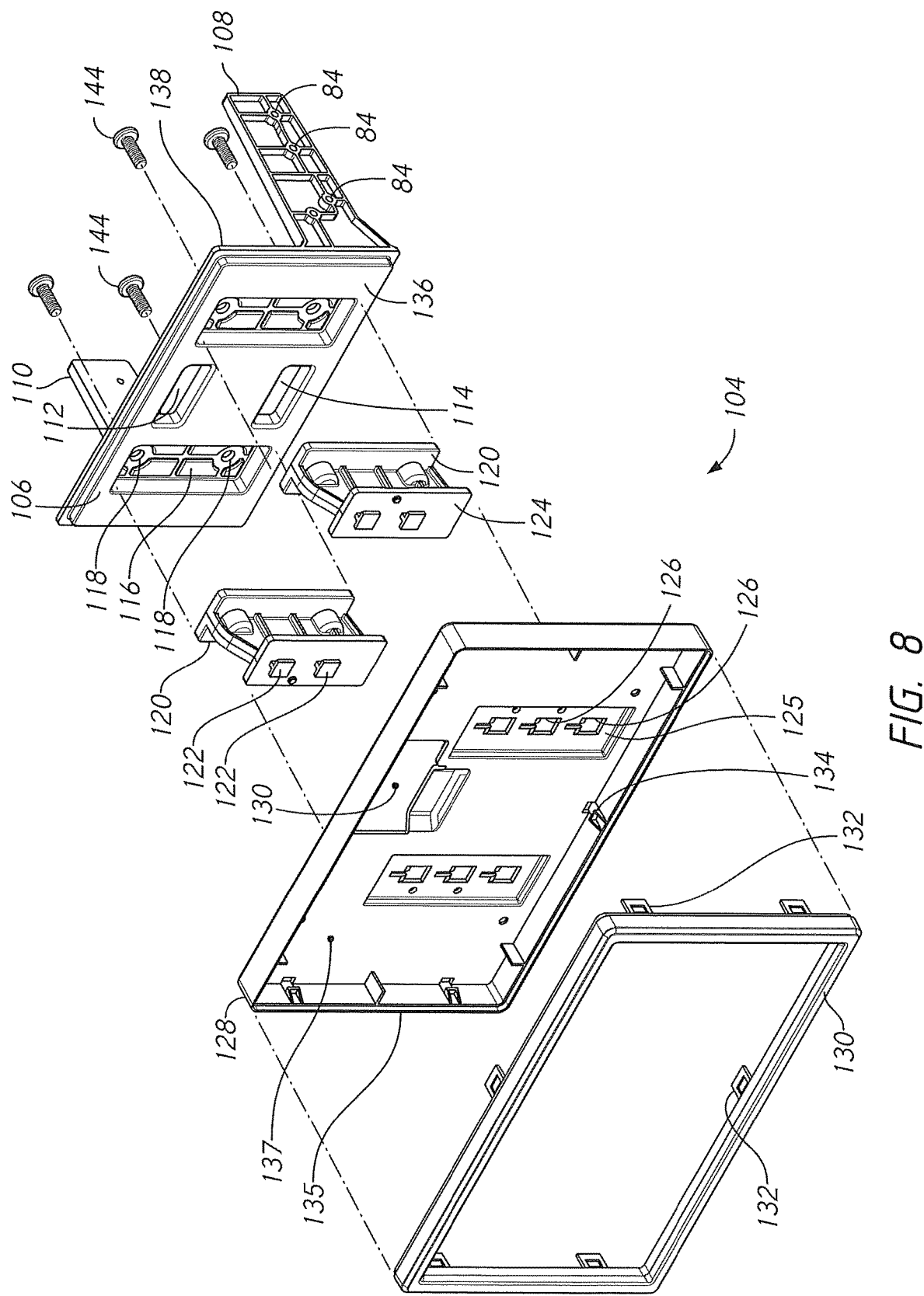
FIG. 8 is an exploded perspective view, showing the inventive mounting system.

FIG. 8 provides an exploded perspective view of an embodiment of the present invention. The embodiment shown is configured to mount both the electronics housing and the separate tablet. As shown, there are five significant components which are configured to be assembled into a working unit. Head unit emulator bracket 106 includes plate 136 with a pair of forward-extending tangs. The directional term "forward" refers to the orientation in which the assembly will ordinarily be installed in a vehicle (Forward is the direction moving toward the front of the vehicle). Right tang 108 and left tang 110 include a series of holes 84—which are configured to receive mounting screws.

In the version shown, the right side of right tang 108 lies in the same plane that would be occupied by the right side of a conventional aftermarket stereo head unit. Likewise, the left side of left tang 110 lies in the same plane that would be occupied by the left side of a conventional aftermarket stereo head unit. In the version shown, plate 136 occupies the same plane as the rearward facing surface of a conventional aftermarket stereo head unit (the portion facing the occupants of the vehicle).

The rearward facing surface of plate 136 opens into a pair of pockets 116. Each of these pockets is sized to receive the base of a standoff 120. Each pocket 116 includes a pair of holes 118. Holes 118 allows screws 144 to pass through the emulator bracket and into holes within the forward portion of each standoff 120 (not visible in the view). The screws are tightened to pull each standoff 120 into a pocket 116. Of course, another embodiment could simply incorporate the standoffs as part of the head unit emulator bracket or some other component. Providing the flexibility to select a different standoff is advantageous, though, as will be explained.

The rearward surface 124 of each standoff 120 includes a pair of T-protrusions 122. Each T-protrusion is configured to lock into a corresponding T-protrusion receiver 126 on tablet receiver 128. Tablet receiver 128 includes a plate 137 with side wall 135 running around its perimeter. Opening 130 is provided through plate 137. A pair of recesses 125 are also provided. Each recess includes three T-protrusion receivers 126. The T-protrusion receivers 126 are designed to receive T-protrusions 122 and thereby lock tablet receiver 128 onto the standoffs. This is done by sliding T-protrusion receivers 126 over the T-protrusions and then urging tablet receiver 128 downward. Each receiver has a notch in its upper edge. This notch locks over the portion of the T-protrusion that is perpendicular to surface 124 on the standoff. The T-protrusion receiver and T-protrusion creates an interlocking feature. Once secured, this interlocking feature produces the result that the tablet receiver can only be removed by deliberately lifting the tablet receiver upward and then moving it rearward to disengage the T-protrusions. A T-protrusion is only one example of an interlocking feature. Many other types are possible.

The reader will note that each recess 125 has three T-protrusion receivers 126 whereas each standoff 120 has only two T-protrusions 122. This arrangement allows the user to vary the vertical position of the tablet receiver with respect to the standoffs. If the upper two T-protrusion receivers are used for the engagement then the tablet receiver will have a relatively low position. If the lower two T-protrusion receivers are used then the tablet receiver will have a relatively high position.

Capture bezel 130 is configured to snap on to tablet receiver 128. Multiple forward-extending snap tangs 132 are provided on capture bezel 130. These features snap into undercuts on protrusions 134 in tablet receiver 128. The tablet receiver also includes suitable spacing ribs which are configured to center a tablet within the volume enclosed by side wall 135.

Figure 9:
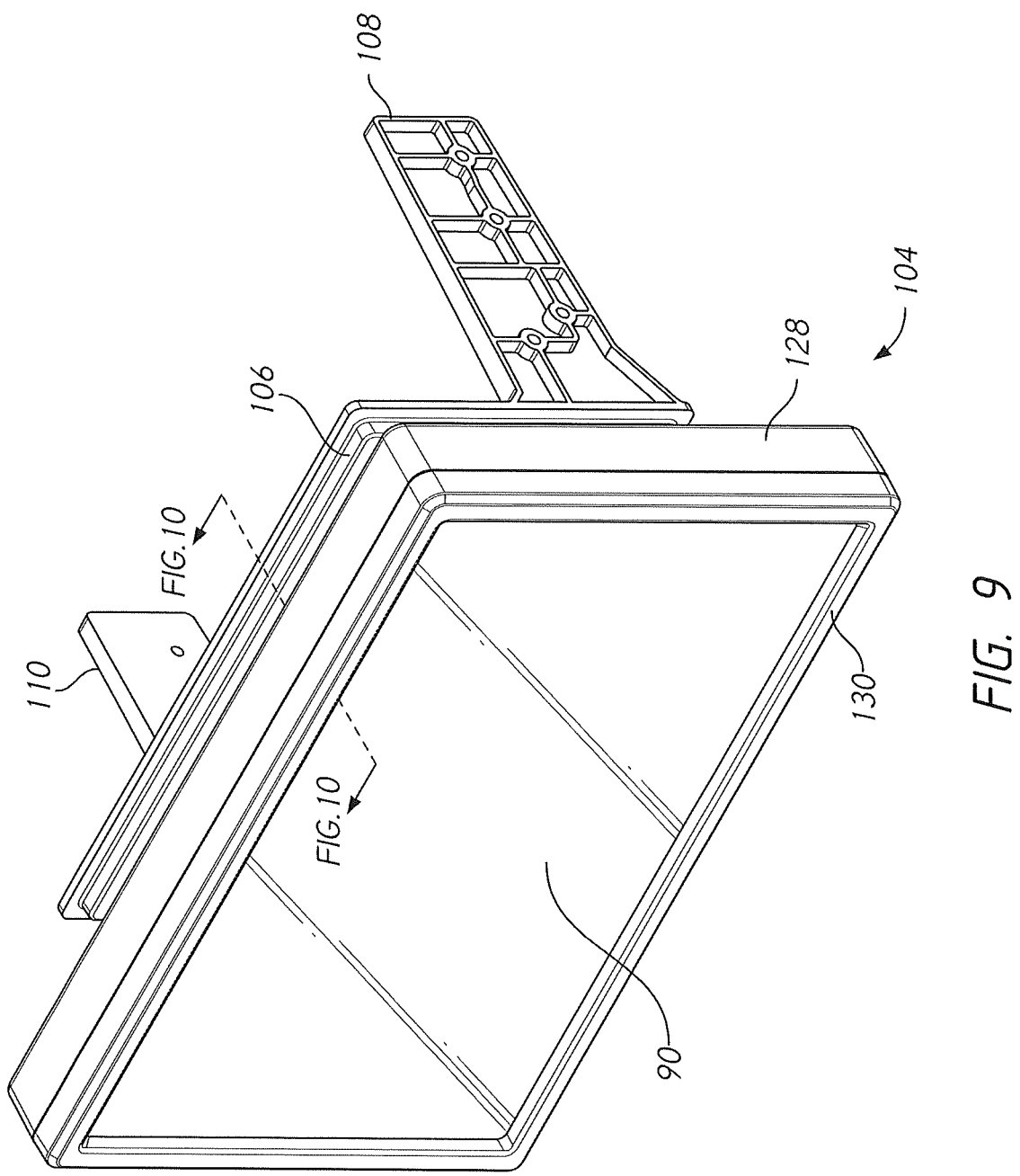
FIG. 9 is a perspective view, showing the assembly of FIG. 8 in an assembled state.

In looking at the components shown in FIG. 8: Standoffs attach to head unit emulator bracket 106. Tablet receiver 128 then attaches to the standoffs. A tablet is placed within tablet receiver 128. The tablet is then captured by snapping capture bezel 130 to tablet receiver 128. FIG. 9 shows the completed assembly with tablet 90 being secured by capture bezel 130.

Figure 10:
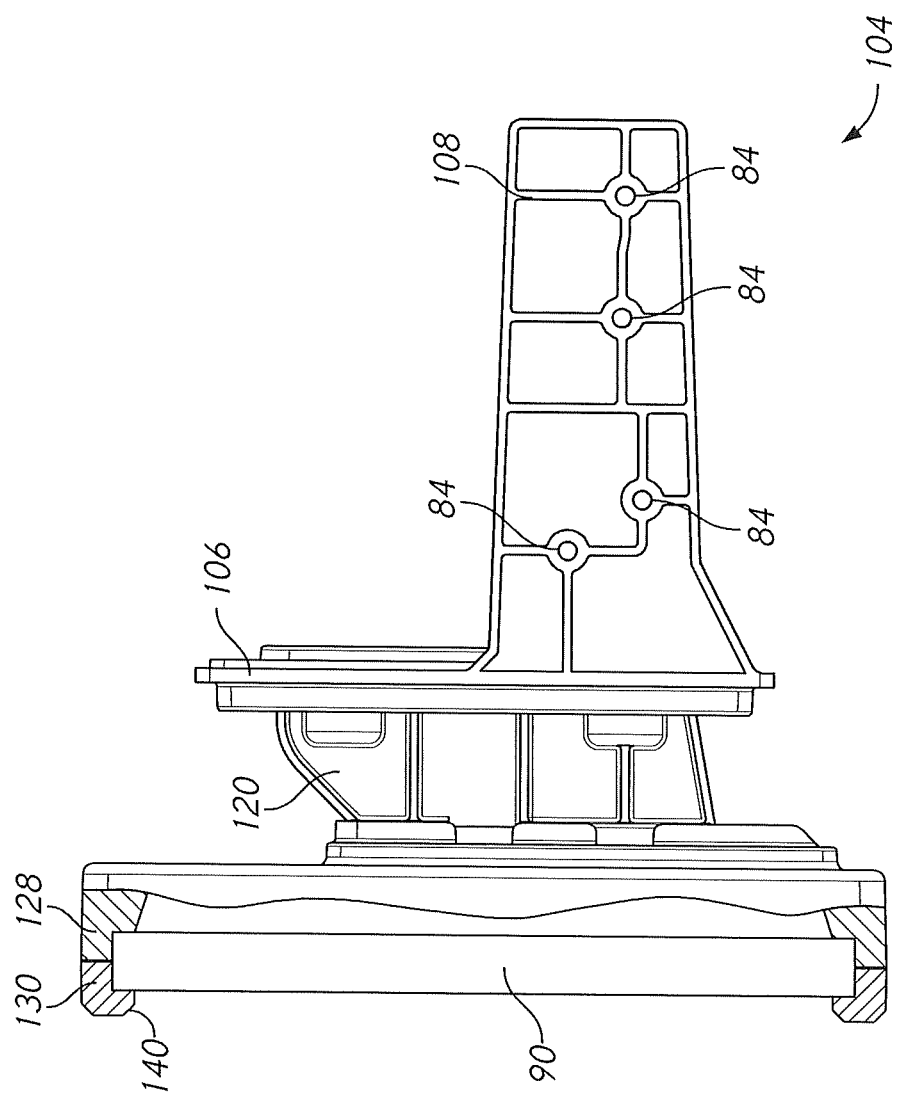
FIG. 10 is a side elevation view, showing the assembly of FIG. 9.

FIG. 9 also shows some section view "call outs" for FIG. 10. These indicate the position of the plane for the section view of FIG. 10.

FIG. 10 presents a partial section view. The section is taken through capture bezel 130 and part of tablet receiver 128, but not through tablet 90. The reader will note how the capture bezel includes overhang 140. The overhang is preferably a continuous feature that runs around the perimeter of the opening through the capture bezel. It abuts tablet 90 so that tablet 90 is secured between the capture bezel and the tablet receiver.

The actual method of attaching capture bezel 130 to tablet receiver 128 is not important to the present invention. Plastic snaps are used in the illustrated embodiments. However, one could also use threaded fasteners. Whatever approach is taken, it is preferable for the capture bezel to be removable in case the user wishes to remove the tablet.

FIG. 10 serves to illustrate the spatial relationship between the components of split head unit mounting system 104. Forward in the vehicle is to the right in the orientation of the view. An array of holes 84 are provided in right tang 108. These allow the attachment of the right tang to the electronics enclosure. Standoffs 120 separates tablet receiver 120 from head unit emulator bracket 106. A different standoff distance and angular relationship can be created by substituting a different standoff 120.

Figure 4:
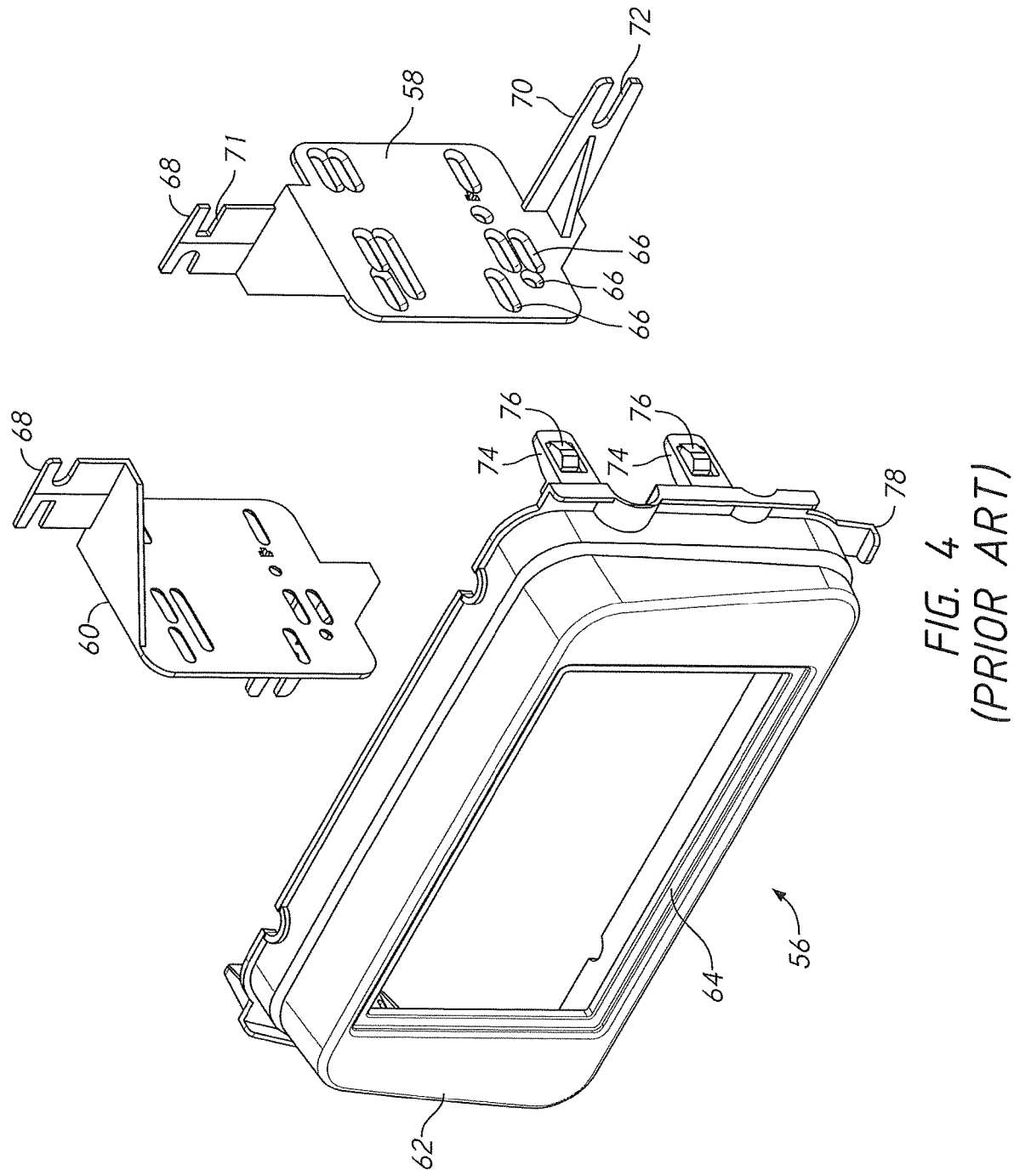
FIG. 4 is an exploded perspective view, showing a prior art bezel and bracket assembly used to mount a standard aftermarket head unit in the vehicle dash of FIG. 1.
Figure 5:
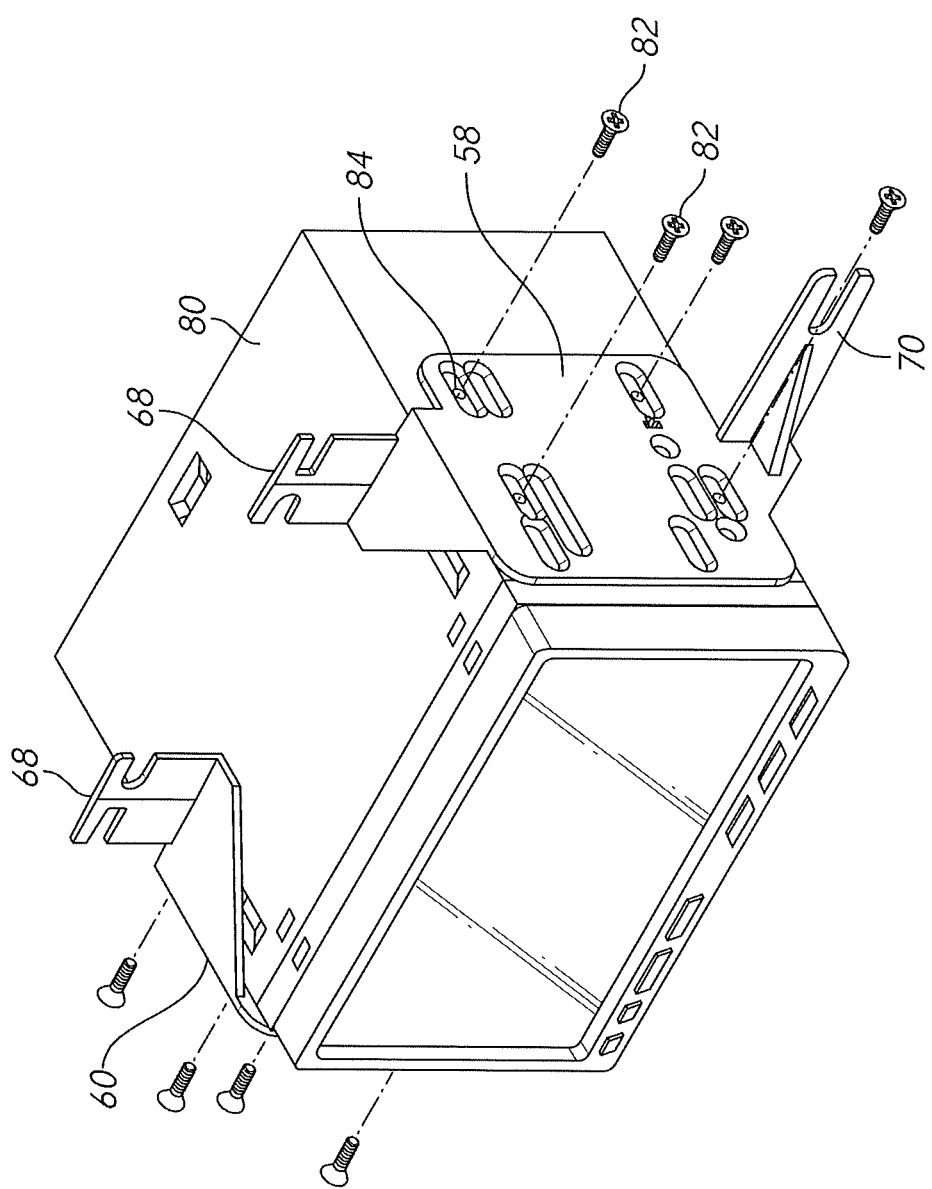
FIG. 5 is an exploded perspective view, showing the bezel and bracket assembly of FIG. 4 attached to a double DIN aftermarket head unit.
Figure 6:
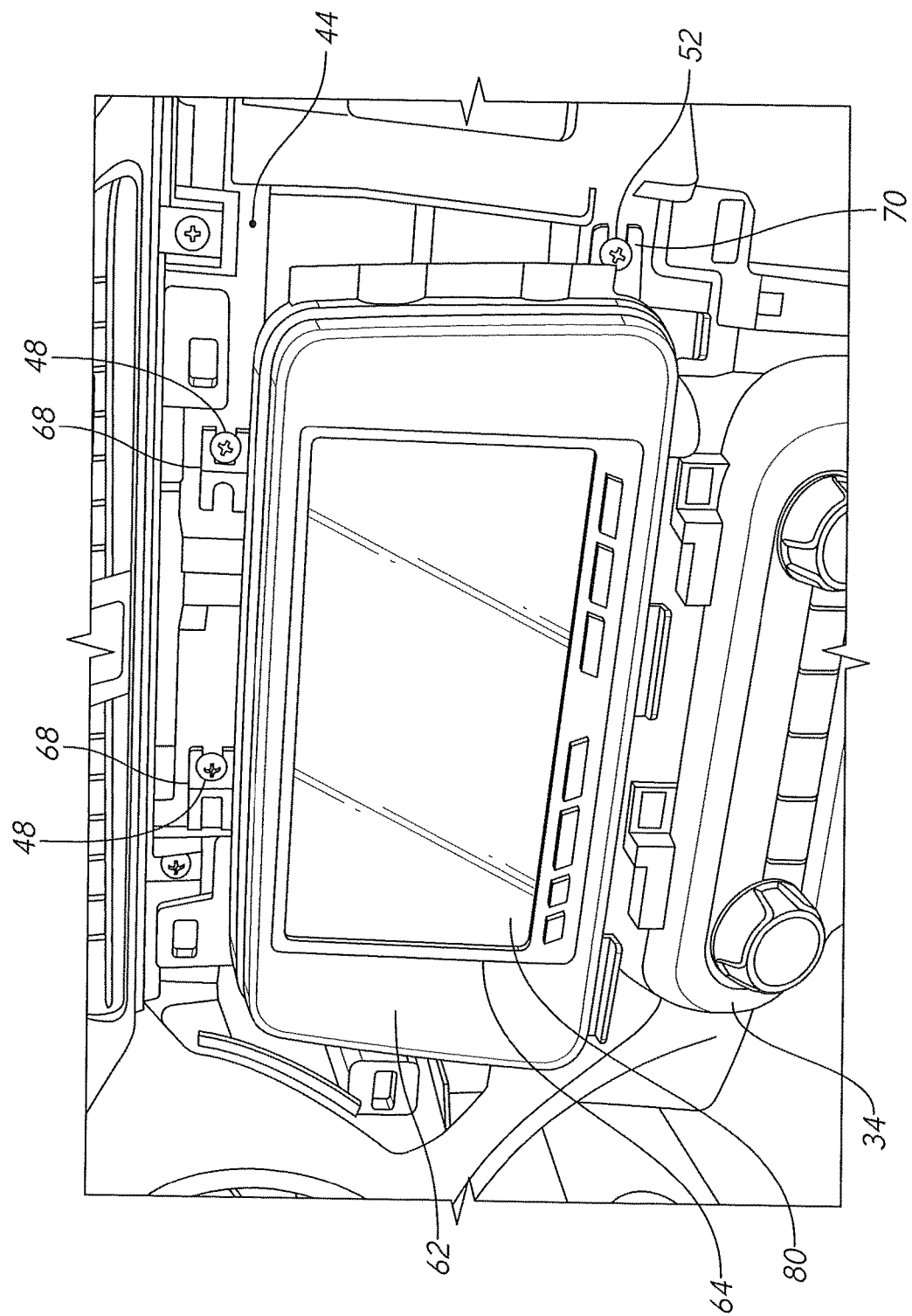
FIG. 6 is a detailed perspective view, showing the double DIN aftermarket head unit mounted in the vehicle dash assembly of FIG. 1.
Figure 7:
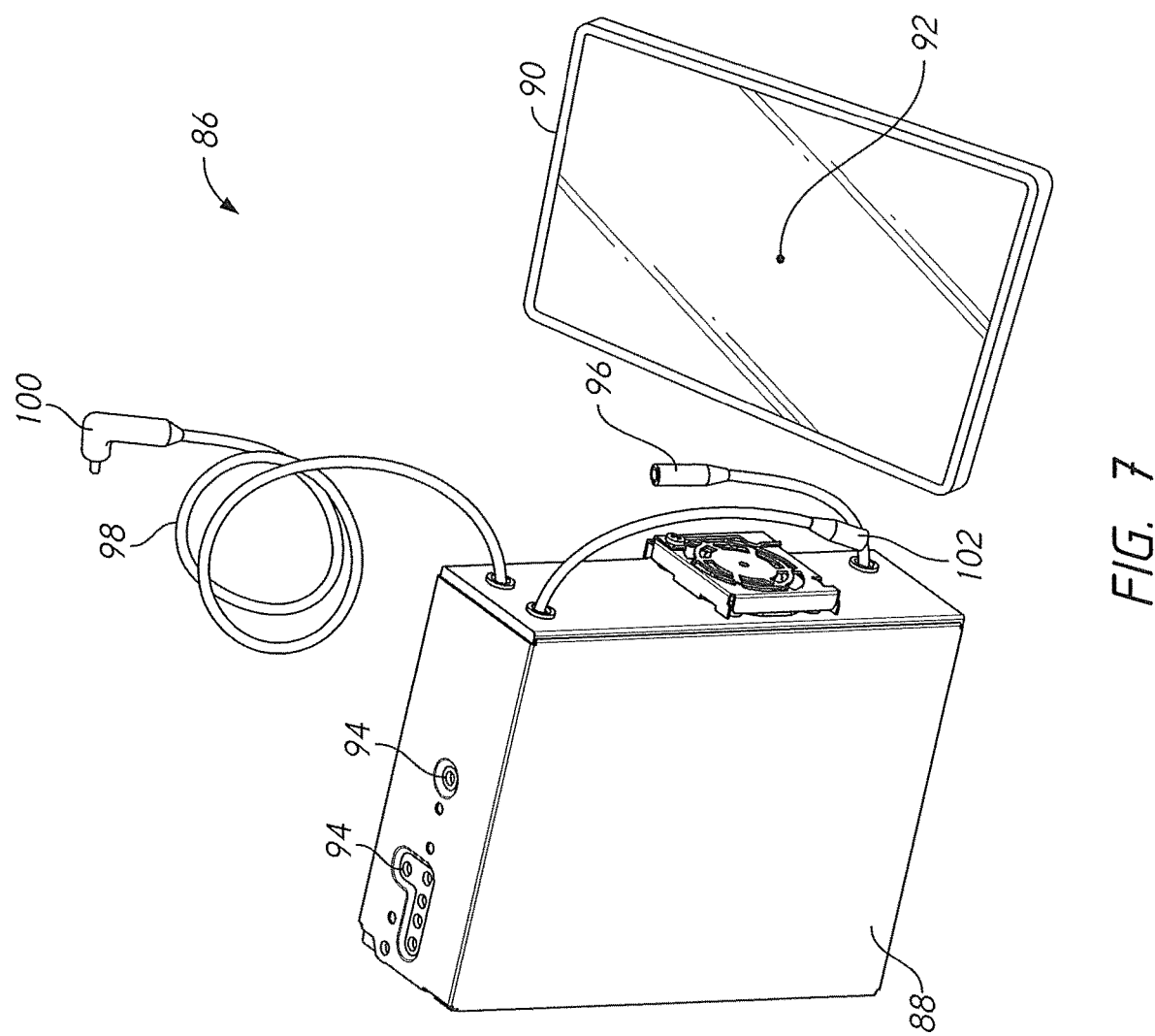
FIG. 7 is a perspective view, showing an aftermarket head unit including an electronics housing controlled by a separate tablet.

The configurations shown in FIGS. 9 and 10 are designed to work with the previously-created kits for mounting aftermarket head units in various vehicle dash assemblies (such as shown in FIGS. 4-6). FIGS. 11-16 illustrate this functionality for one specific kit. The reader should bear in mind, however, that the present invention can be used with many different kits.

Figure 11:
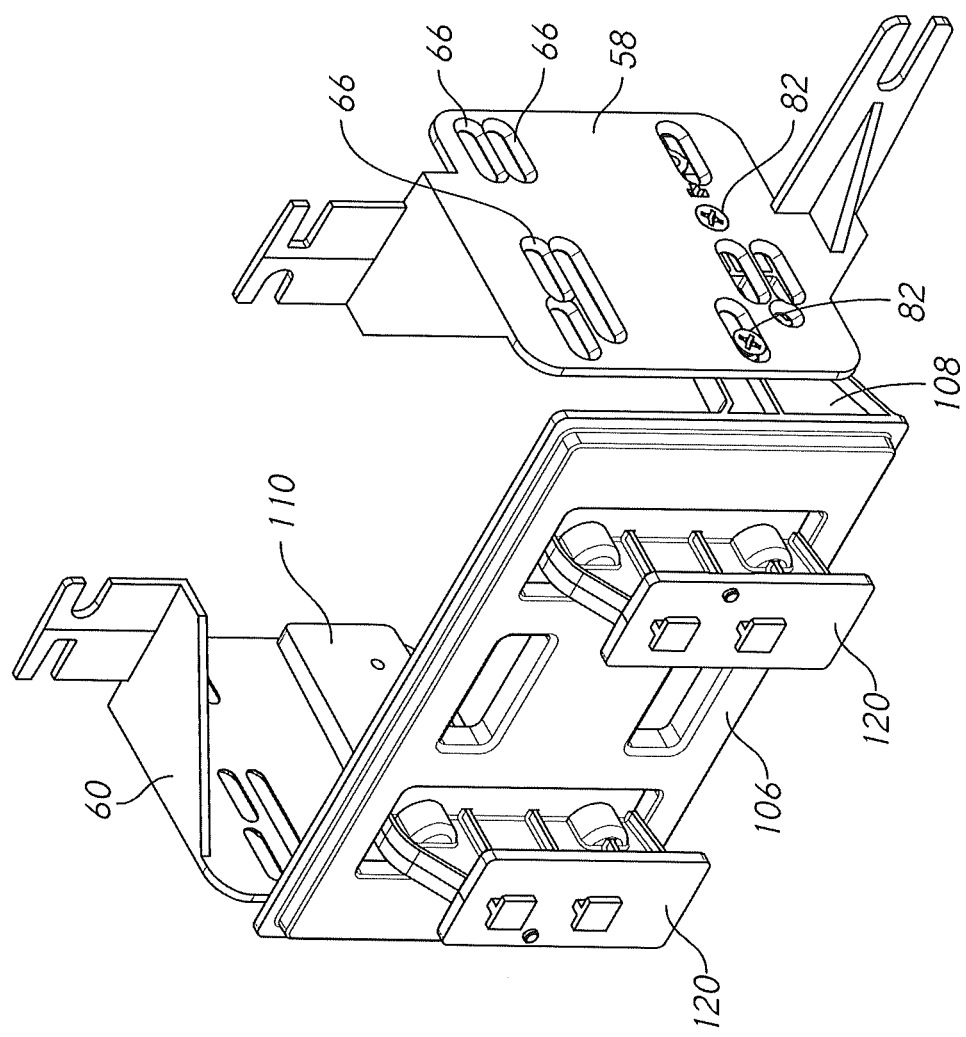
FIG. 11 is a perspective view, showing the inventive mounting system combined with the mounting brackets of FIG. 4.

FIG. 11 shows the first step in assembling an embodiment of the inventive mounting system. The order of assembly is generally not significant. In this case, the two standoffs 120 have first been attached to head unit emulator bracket 106. Right attachment bracket 58 has been attached to right tang 108 using a pair of screws 82. Left attachment bracket 60 has been attached to left tang 110 using a second pair of screws (not visible in the view). The upper portion of hole/slot array 66 on the two brackets is unencumbered by the attachment to the left and right tangs. This leaves the upper portion of each bracket open.

Figure 12:
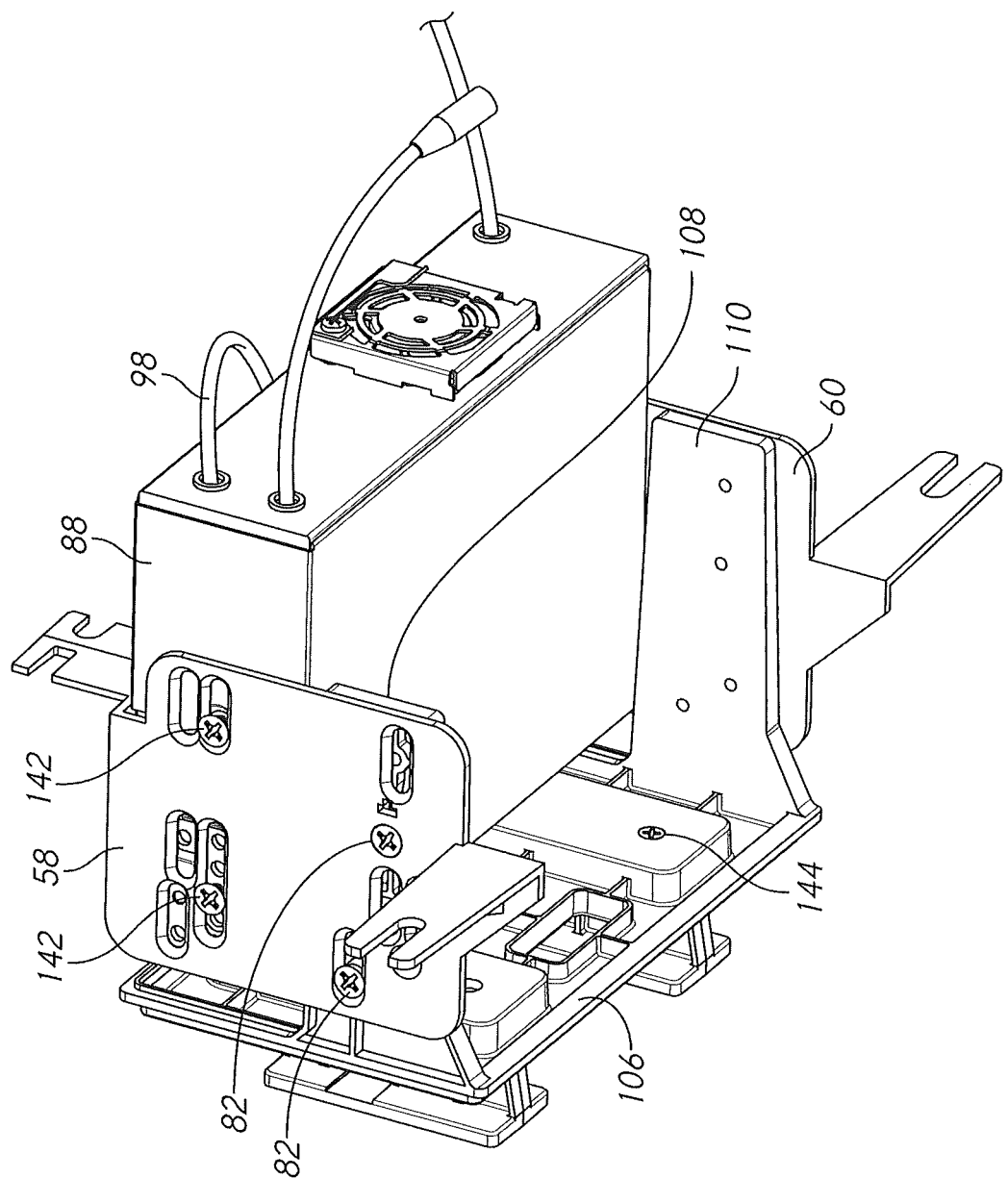
FIG. 12 is a perspective view, showing the assembly of FIG. 11 with an attached electronics housing.

FIG. 12 shows the same assembly with the addition of electronics housing 88. The electronics housing may be mounted separately from head unit emulator bracket 106. It is convenient to use the head unit emulator bracket to also mount the electronics housing, however, and this is the option that is shown in the view. The electronics housing in this example is connected to the two attachment brackets 58, 60 by passing screws 142 through the hole/slot arrays and into threaded holes in the side of the electronics housing. The two tangs 108,110 lie just below the position of electronics housing 88 and do not interfere with its installation. It is preferable to install the standoffs on head unit emulator bracket 106 before installing electronics housing 88. Screw 144 is one of the four screws used to attach the standoffs. As one can see in FIG. 12, the upper screws used to mount the standoffs are hidden by the electronics housing.

Figure 13:
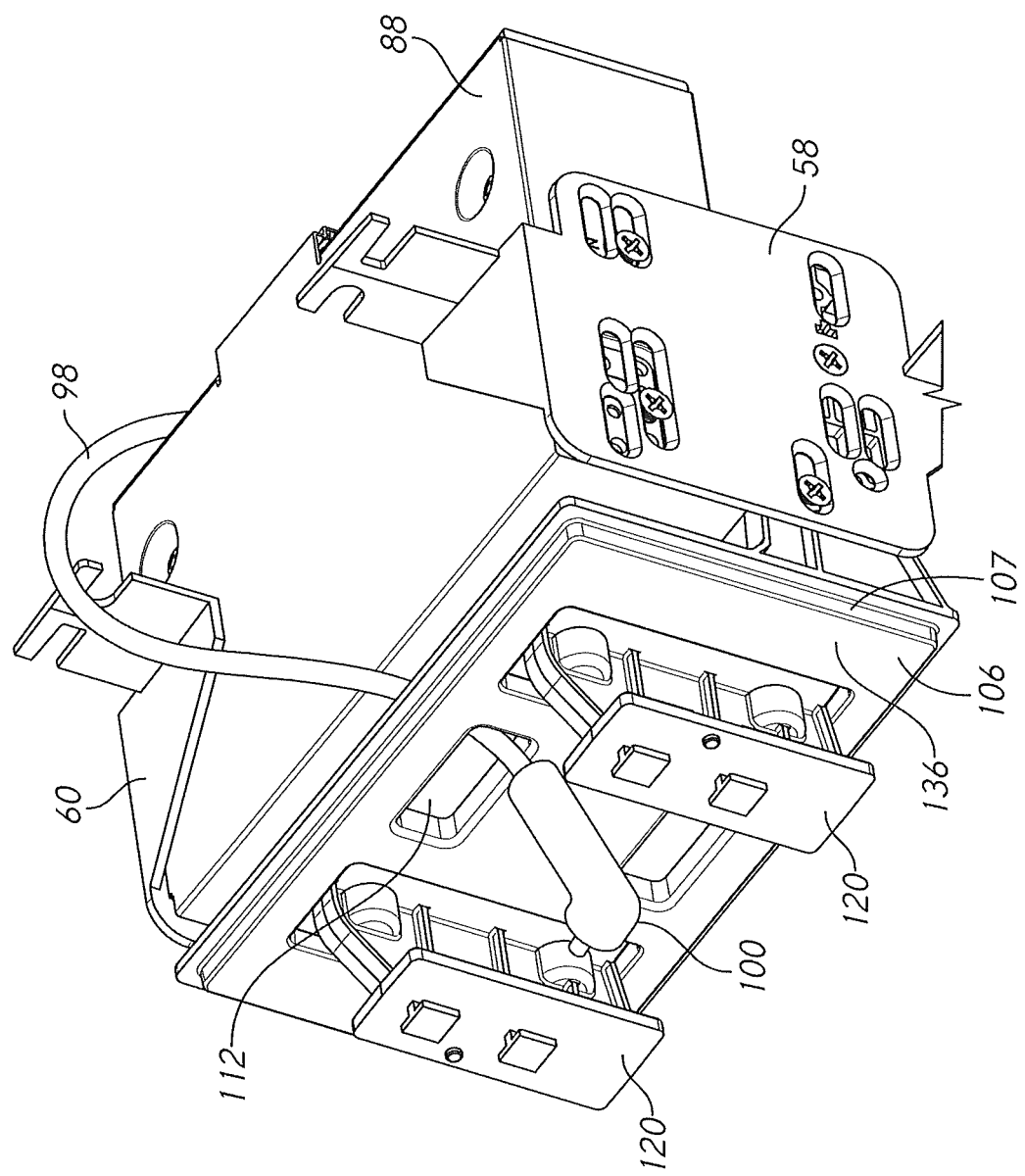
FIG. 13 is a perspective view, showing the assembly of FIG. 12 from a different vantage point.

Tablet interface cable 98 passes over the top of electronics housing 88 in this view. FIG. 13 shows the same assembly looking at the rearward facing side of head unit emulator bracket 106. The reader will observe how tablet interface cable 98 passes over the top of electronics housing 88 and through opening 112 in the head unit emulator bracket. Tablet connector 100 is in position to connect to the tablet when the tablet is put in place.

Perimeter 107 of the head unit emulator bracket ("outer emulator bracket perimeter") is preferably sized to fit in a standard opening—such as a double DIN standard opening (or a single DIN standard opening in the case of using that size). Even more preferably, perimeter 107 is sized and shaped to fit precisely within the standard DIN opening. FIG. 13 shows the assembly ready to install in a vehicle. Returning briefly to FIG. 12, the reader will note that the other connection cables—at the rear of the electronics module—can be connected to the existing vehicle wiring before the assembly is pushed into the cavity in the dash. This includes connections for the speakers and one or more antennas, as well as possibly other connections. The orientation shown in FIG. 13 is typically used to push the assembly into the dash.

Figure 14:
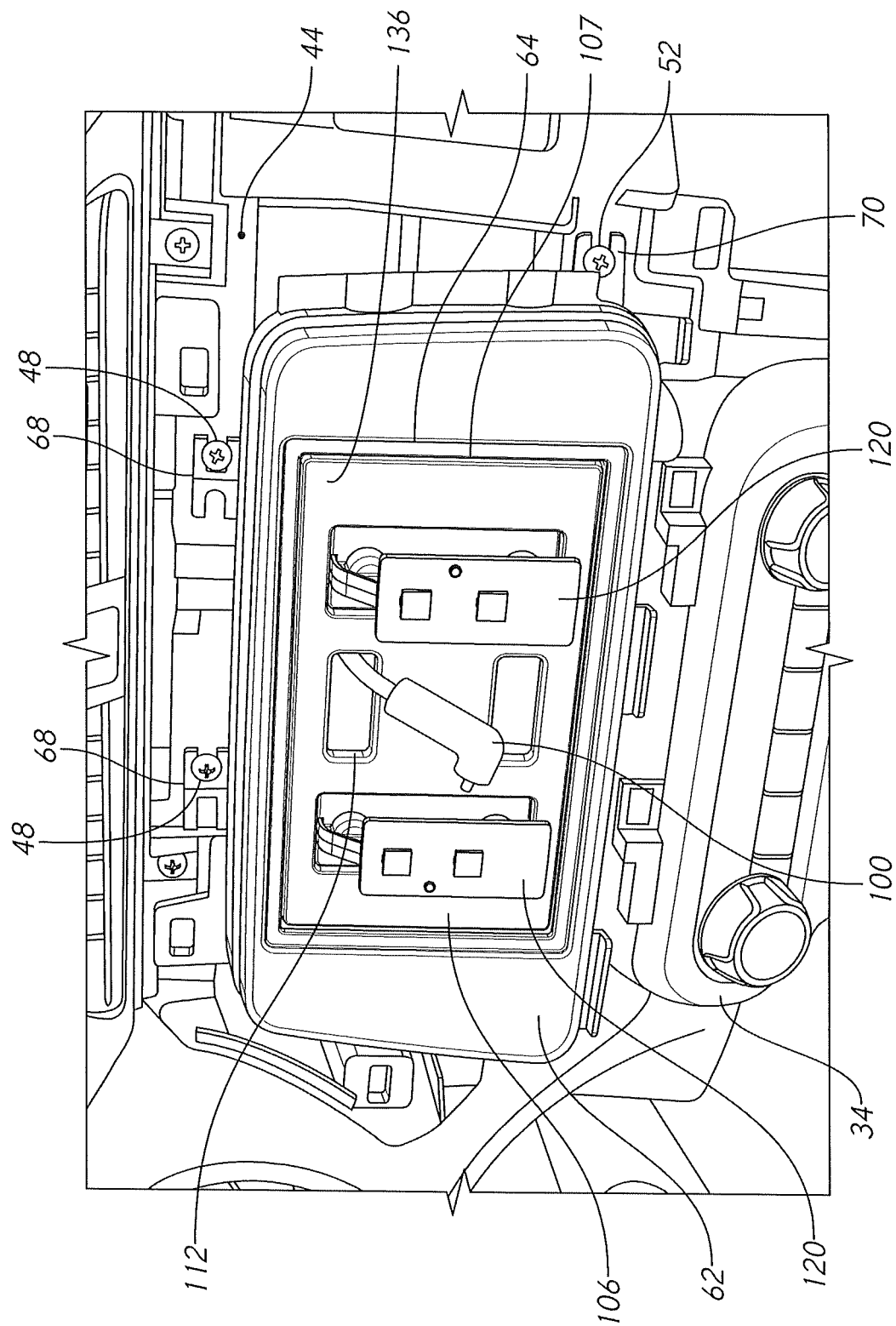
FIG. 14 is a detailed perspective view, showing the assembly of FIGS. 12 and 13 installed in the vehicle dash assembly of FIG. 1.

FIG. 14 shows the assembly actually installed in the dash of the vehicle. The reader will note how perimeter 107 of plate 136 fits just inside standard opening 64 of bezel 62. In this case the standard opening is a double DIN size opening. Plate 136 "blanks off" the double DIN opening and creates a finished appearance. Screws 48 have been used to secure upper tabs 68 to dash mounting frame 44. Screws 52 have been used to secure lateral tabs 70 to the dash mounting frame. Bezel 62 may be attached to head unit emulator bracket 106 as shown. Alternatively, bezel 62 can be attached to the vehicle's center bezel 14 as described previously. In this latter case bezel 62 will slide securely around head unit emulator bracket 106 when center bezel 14 is installed.

Figure 15:
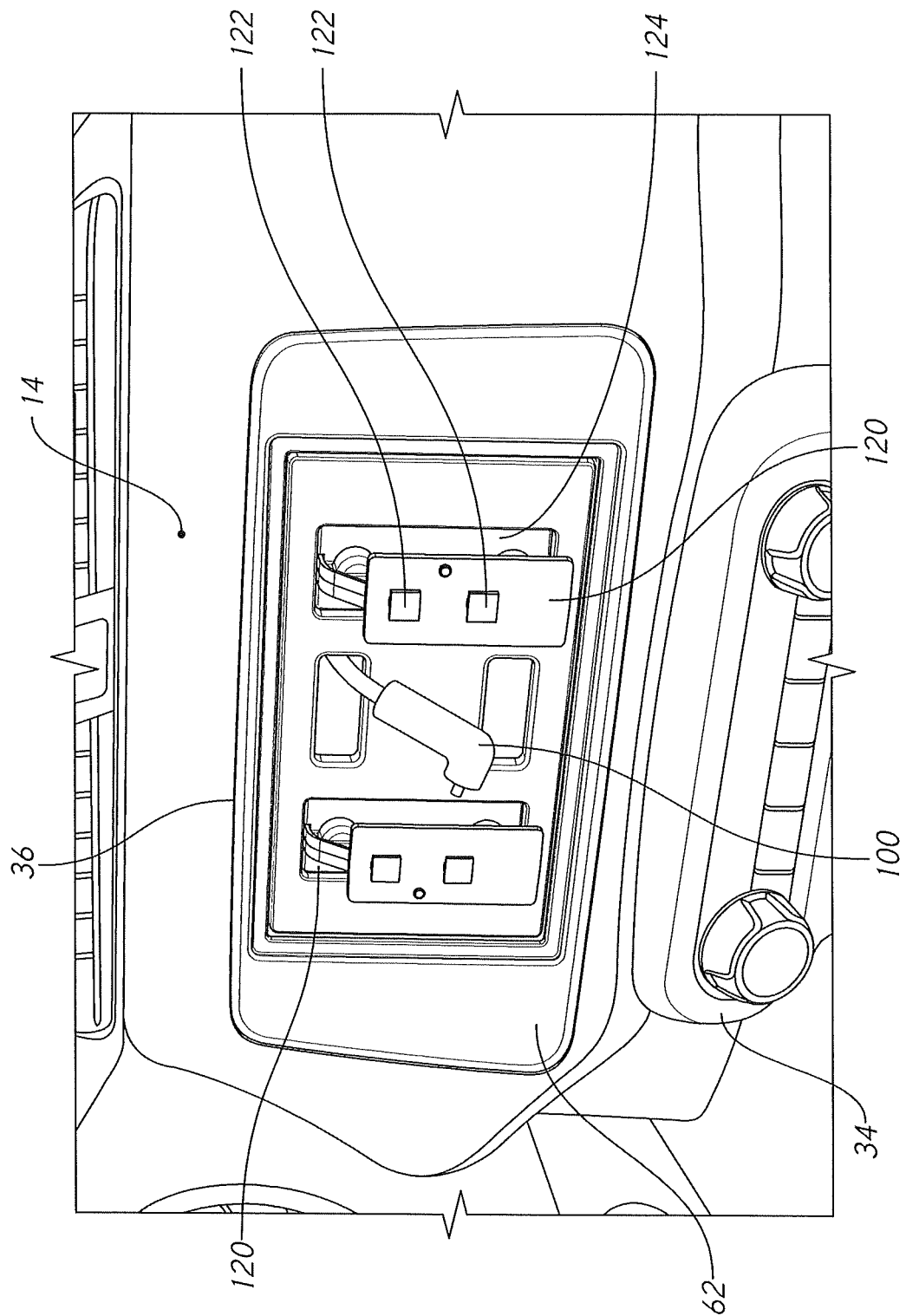
FIG. 15 is a detailed perspective view, showing the assembly of FIG. 14 with the addition of a prior art center bezel.

FIG. 15 shows the installation with center bezel 14 reinstalled in the vehicle. The reader will note how the outer perimeter of bezel 62 fits tightly within the OEM head unit opening within center bezel 14. The two standoffs 120 extend well clear of center bezel 14. Surfaces 124 and T-protrusions 122 are available for mounting the tablet. Tablet connector 100 is provided in a position where it can be easily connected to the tablet.

Tablet receiver 128 (see FIG. 8) is attached to the standoffs 120 by slipping the T-slot receivers over the T-protrusions 122 on the standoffs 120. The tablet receiver is thereby secured to surface 124. Tablet connector 100 is then plugged into the jack on the back of the tablet and the tablet is then placed within tablet receiver 128. Once the tablet is in place within the tablet receiver capture bezel 130 is snapped into tablet receiver 128 to retain the tablet.

Figure 16:
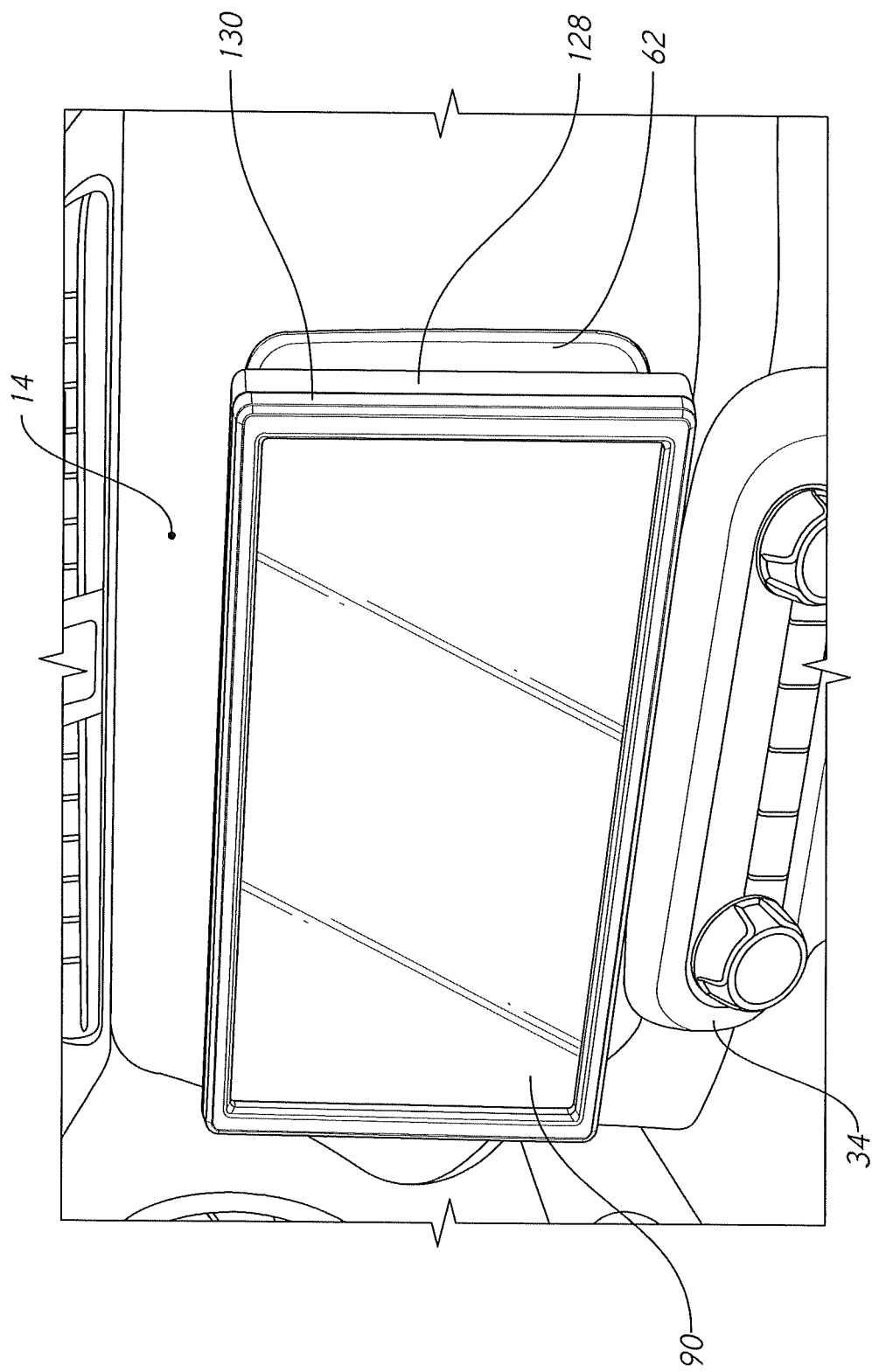
FIG. 16 is a detailed perspective view, showing the assembly of FIG. 15 with the addition of the tablet-mounting components and the tablet.

FIG. 16 shows the installed configuration. For this particular car tablet 90 is positioned just above the location of environmental panel 34, where it can be easily reached by the user. Tablet 90 is held in this position via being secured between tablet receiver 128 and capture bezel 130. Most of the area behind the tablet receiver is no longer visible once the configuration of FIG. 16 is completed. However, some lateral portions of bezel 62 may be visible. The visible portions have a dressed and finished appearance using the inventive installation kit.

Figure 17:
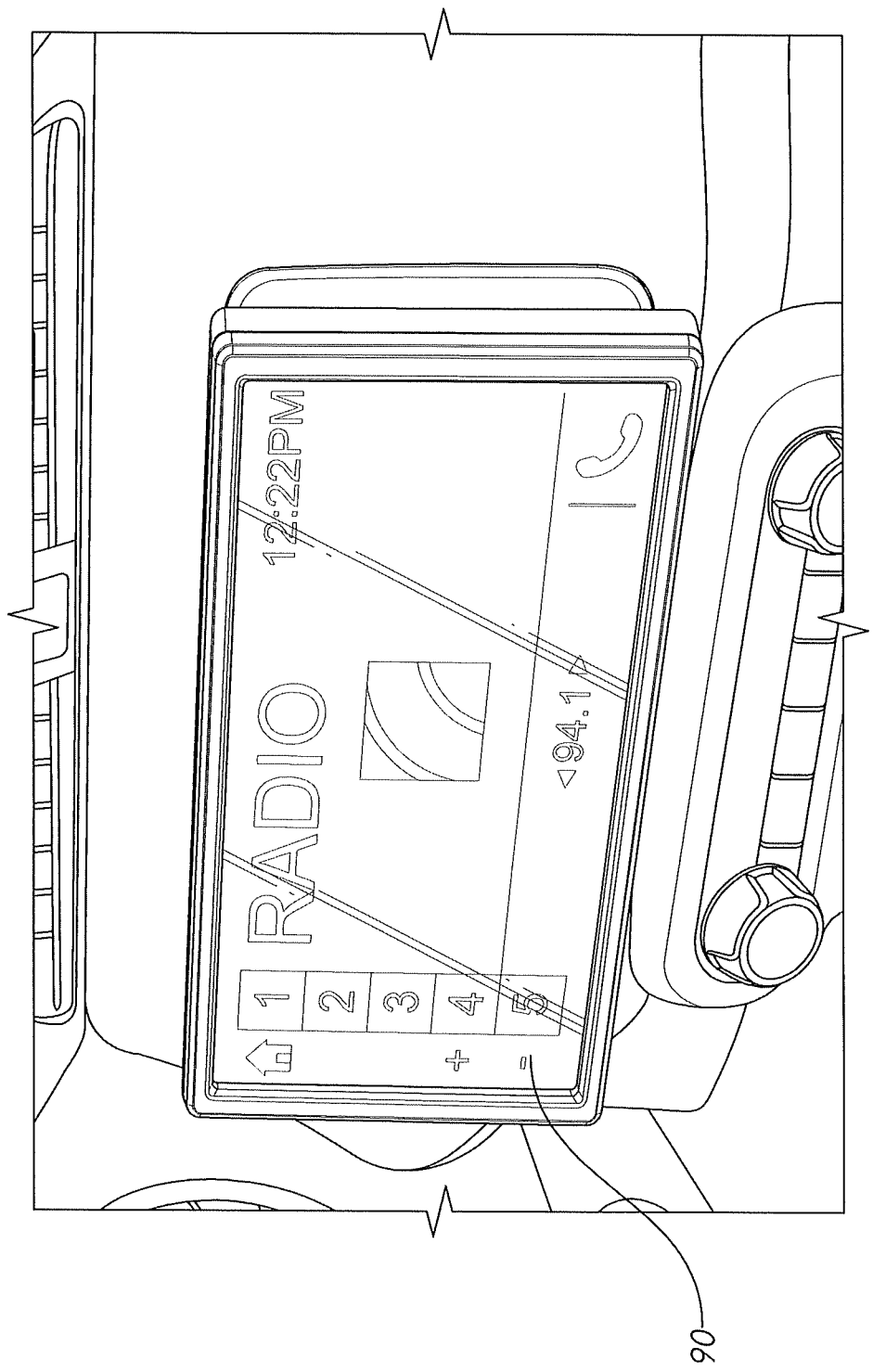
FIG. 17 is a perspective view, showing the assembly of FIG. 16 in operation.

FIG. 17 shows the assembly of FIG. 16 with tablet 90 being activated and in use. It is possible to provide a virtually endless variety of user interfaces on the tablet. A menu structure is preferably provided, so that the user can select different pages for providing functions such as radio tuning, cell phone operation, navigation functions, etc. FIG. 17 shows a user interface ("UI") display that is appropriate for picking pre-programmed radio channels. Other menu functions are shown as well. The entire operation of the aftermarket head unit is preferably controlled via tablet 90 so that no other controls are needed. However, some users may wish to retain some parallel controls such as steering-wheel mounted switches. The retention of these features is optional.

Returning to FIG. 15, the reader will note that the position and orientation of the tablet with respect to center bezel 14 depends upon the two standoffs 120. It is preferable to provide a variety of standoffs for at least two reasons. First, different center bezel 14 shapes will favor different standoffs. A flat center bezel may need only a small standoff distance. A sharply curved center bezel, however, may require a larger standoff distance.

Figure 18:
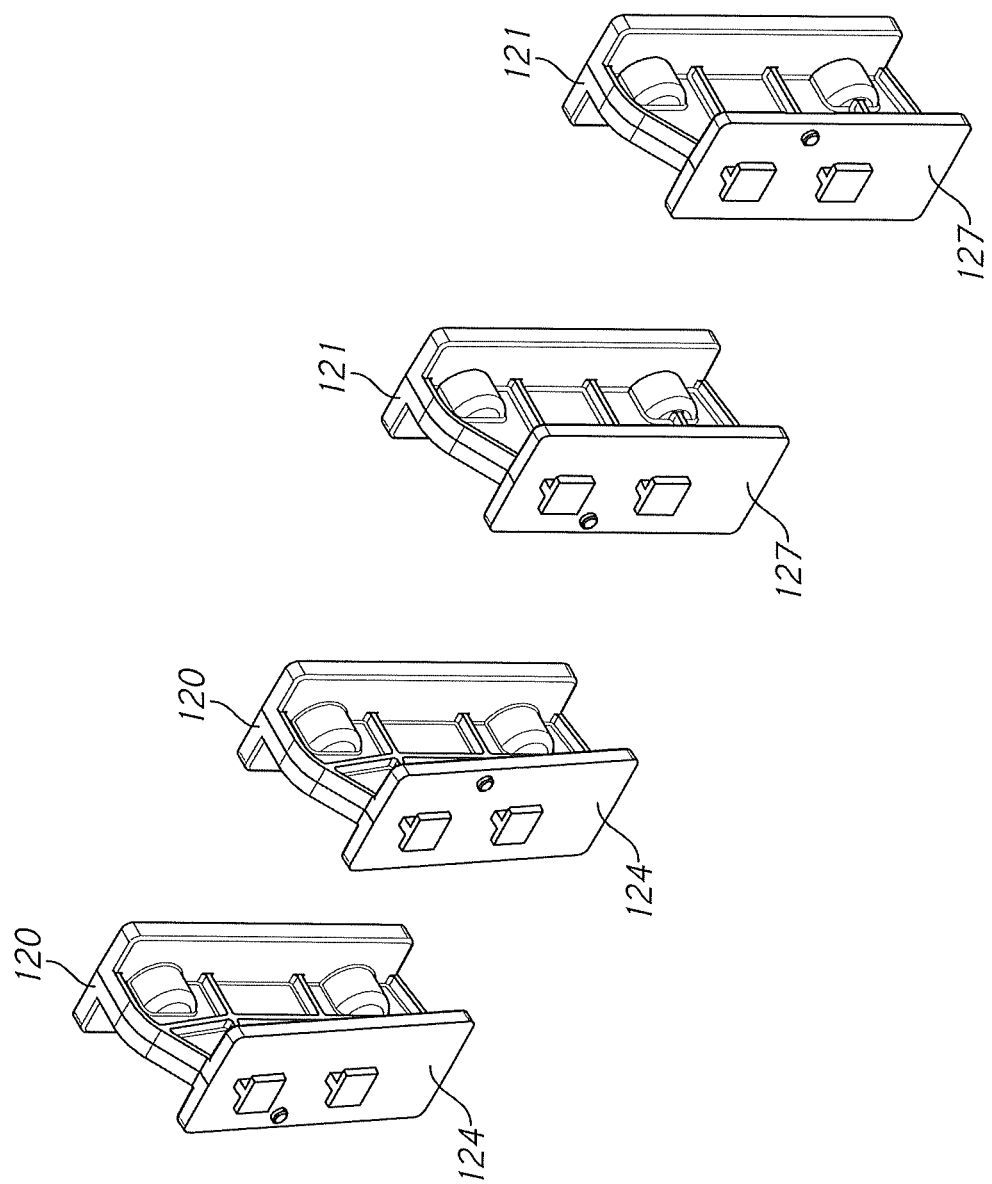
FIG. 18 is a perspective view, showing alternate embodiments for the standoffs.

Second, it is desirable to provide standoffs having a different angular orientation for surfaces 124 in order to adjust the angle of presentation for the tablet. FIG. 18 demonstrates this concept. The standoffs in these exemplary embodiments are furnished in pairs. For standoffs 121, each surface 127 is parallel to the standoff's base. For standoffs 120, each surface 124 is titled forward about 10 degrees. When standoffs 120 are used, the tablet's surface will be tilted more forward than if standoffs 121 are used. Still more standoffs can be provided with a tilt of 20 degrees or more.

As stated previously, the present invention can be used with a wide variety of bezel/bracket mounting kits that have been previously developed by the inventors. The preceding examples have used the mounting kit 56 shown in FIG. 4. That particular kit is configured for a 2018 Nissan Kicks automobile. It will not fit a different type of automobile.

Figure 19:
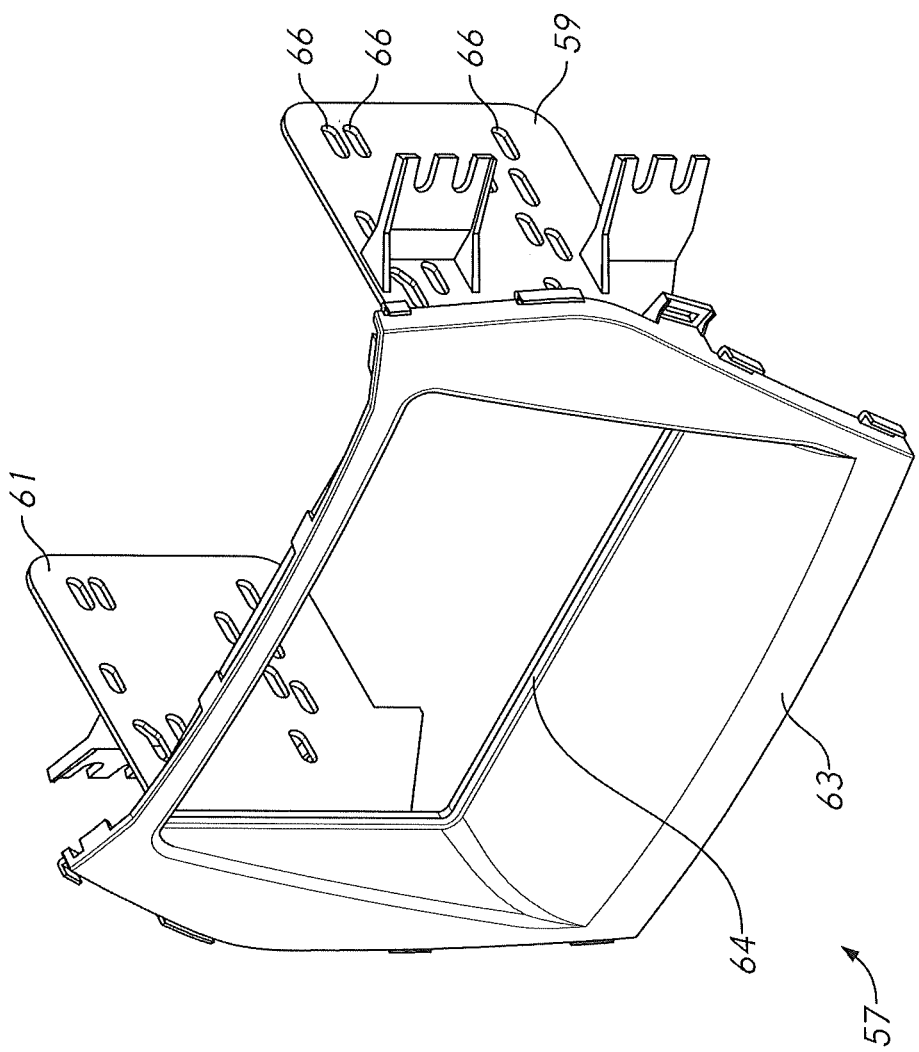
FIG. 19 is a perspective view, showing an alternate bezel and bracket assembly used to mount a standard aftermarket head unit in a vehicle dash of a type that is different from the vehicle dash depicted in FIG. 1.

FIG. 19 shows a mounting kit 57 that is configured for a different type of automobile—a 2016 Hyundai Santa Fe. Bezel 63 has a shape that is designed to smoothly blend standard opening 64 (sized for a double DIN receiver) into a surrounding Santa Fe dash. Right attachment bracket 59 and left attachment bracket 61 contain the standardized hole slot/array 66. However, the reader will observe that the mounting tabs and slots (the dash mounting features) are quite different from those found on the brackets in the kit shown in FIG. 4.

The steps for using the mounting kit to install the tablet interface and electronics housing are the same as described for the example of FIGS. 11-16. Appropriate standoffs are selected for the head unit emulator bracket 106. Right and left attachment brackets 59,61 are then attached to the head unit emulator bracket 106. Electronics housing 88 is then optionally connected to the right and left attachment brackets (or mounted elsewhere if desired). The assembly is then mounted to the vehicle's dash. At the appropriate time bezel 63 is added. The vehicle's center bezel is then reinstalled and the tablet receiver, tablet, and capture bezel are attached to the standoffs.

Figure 20:
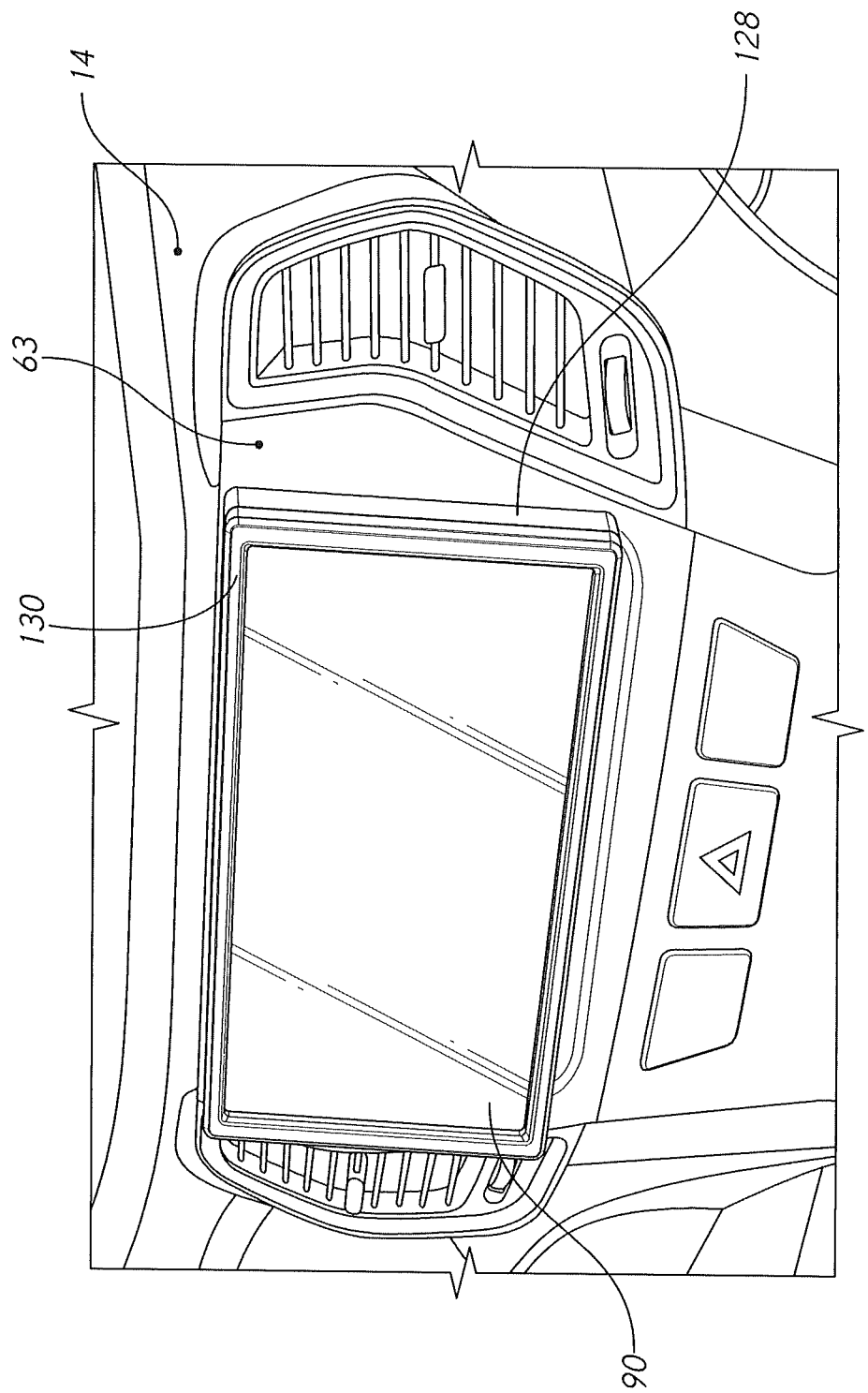
FIG. 20 is a perspective view, showing the inventive kit installed in a vehicle using the alternate bezel and bracket assembly from FIG. 19.

FIG. 20 shows the completed assembly with tablet 90 in place. The reader will observe that the surrounding dash (including center bezel 14) is quite different from the one depicted in FIG. 15. The inventive mounting system allows the tablet and electronics housing to be mounted in a virtually endless variety of vehicles. The use of varied standoffs allows the installer to set an optimum standoff distance and viewing angle for the tablet.

Having thus provided a detailed explanation of some exemplary embodiments, some general statements can be made about the invention:

1. A tablet receiver is provided. This tablet receiver is configured to hold a tablet that is part of a split head unit.

2. A tablet receiver mounting assembly is provided.

3. A bezel is provided, with the bezel being configured to smoothly blend at least the visible portions of the tablet receiver mounting assembly into the surrounding OEM dash.

As to the specific embodiments described in detail:

1. The tablet receiver mounting system includes a left and right attachment bracket.

2. Each attachment bracket includes dash mounting features such as slotted tabs, tangs, or hook tabs. Each attachment bracket also includes a hole/slot array.

3. The tablet receiver mounting system includes a head unit emulator bracket. This forms a "link" between the attachment brackets and the tablet receiver.

4. The head unit emulator bracket may include one or more integral standoffs. Optionally, the one or more standoffs may be separate pieces that are joined to the head unit emulator bracket.

5. The tablet receiver may be connected to the one or more standoffs, or directly to the head unit emulator bracket. It is preferable for the tablet receiver to be selectively removable, such as by using an interlocking feature between the tablet receiver and the standoffs or between the tablet receiver and the head unit emulator bracket.

6. A separate capture bracket may be used to secure the tablet to the tablet receiver.

Many other features and variations are possible. These include:

1. Providing a wireless link between the tablet and other controlling or memory device. One example of such a wireless link is a BLUETOOTH link between a user's smartphone and tablet 90.

2. Using the tablet to control many functions beyond those customarily contained in an aftermarket head unit. Electronics housing 88 can be connected to a vehicle's CAN bus. This allows the touch screen on the tablet to display vehicle parameters. It also allows the user to create CAN bus commands by touching icons on the touch screen on the tablet. Using these commands the UI on the tablet can cause actions such as rolling down the windows or adjusting the vehicle's temperature.

3. Providing standoffs that include a tilt adjustment so that the user can vary the tilt of the tablet after it is installed.

4. Providing a single central standoff with a ball-and-socket that allows the user to vary the tilt of the tablet in an infinite variety of positions. In this version the tablet receiver attaches to a single standoff via the ball-and-socket joint. A locking lever can be included, with a portion of the locking lever sticking out beyond the tablet receiver so that the user can unlock the joint, reorient the tablet, and re-lock the joint.

5. An embodiment where the tablet receiver, the standoffs, and the head unit emulator bracket are locked together by passing fasteners through the tablet receiver and standoffs and into the head unit emulator bracket. In this version the head unit emulator bracket is installed into the vehicle without the standoffs in place. The vehicle's center dash can even be put into place without the standoffs in place. The installer is then able to try two or more sets of different standoffs without having to remove the assembly. One version of this embodiment includes threaded receivers in the head unit emulator bracket and through-holes in the standoffs and the tablet receiver. Machine screws are passed through the through holes and tightened into the threaded receivers. The threaded receivers can be metallic inserts that are molded into the head unit emulator bracket.

6. Molding the standoff or standoffs and the head unit emulator bracket as one integral piece.

7. Molding the tablet receiver and the standoff or standoffs as one integral piece.

8. The right and left attachment brackets can be made as one integral attachment bracket.

Although the preceding descriptions contain significant detail, they should not be construed as limiting the scope of the invention but rather as providing illustrations of the preferred embodiments of the invention. Those skilled in the art will know that many other variations are possible without departing from the scope of the invention. Accordingly, the scope of the invention should properly be determined with respect to the following claims rather than the examples given.

Having described our invention, we claim:

1. In a split head unit having an electronics housing and a separate tablet, a mounting system configured to mount said tablet to an existing vehicle dash assembly, comprising:
   (a) a bezel having a standard opening configured to receive a conventional aftermarket stereo head unit and an outer bezel perimeter, with said outer bezel perimeter configured to fit tightly within an OEM head unit opening in said vehicle dash assembly;
   (b) a head unit emulator bracket, including,
      (i) an outer emulator bracket perimeter, said outer emulator bracket perimeter being configured to slide into said standard opening in said bezel,
      (ii) a right tang extending forward, said right tang having a right side,
      (iii) a left tang extending forward, said left tang having a left side,
      (iv) wherein said left side of said left tang is offset from said right side of said right tang a distance that is equal to a width of said conventional aftermarket stereo head unit;
   (c) a right attachment bracket connected to said right tang, said right attachment bracket including dash mounting features configured to attach said right attachment bracket to said existing vehicle dash assembly;
   (d) a left attachment bracket connected to said left tang, said left attachment bracket including dash mounting features configured to attach said left attachment bracket to said existing vehicle dash assembly;
   (e) a standoff attached to said head unit emulator bracket;
   (e) a tablet receiver attached to said standoff; and
   said tablet receiver being configured to hold said tablet.

2. The mounting system as recited in claim 1, wherein:
   (a) said right tang includes a plurality of right tang holes;
   (b) said right attachment bracket is connected to said right tang by passing a plurality of right tang mounting screws through said right attachment bracket and into said plurality of right tang holes;
   (c) said left tang includes a plurality of left tang holes; and
   (d) said left attachment bracket is connected to said left tang by passing a plurality of left tang mounting screws through said left attachment bracket and into said plurality of left tang holes.

3. The mounting system as recited in claim 2, wherein:
   (a) said head unit emulator bracket includes a plate occupying the same plane as a front face of said conventional aftermarket stereo head unit; and
   (b) said standoff is attached to said plate.

4. The mounting system as recited in claim 1, wherein:
   (a) said right attachment bracket includes a set of right attachment bracket upper holes configured for use in the attachment of said electronics housing to said right attachment bracket and
   (b) said left attachment bracket includes a set of left attachment bracket upper holes configured for use in the attachment of said electronics housing to said left attachment bracket.

5. The mounting system as recited in claim 1 wherein said standard opening in said bezel is selected from the group consisting of a single DIN opening and a double DIN opening.

6. The mounting system as recited in claim 1, further comprising a capture bezel configured to attach over a front of said tablet and lock into said tablet receiver.

7. The mounting system as recited in claim 1, wherein said tablet receiver is attached to said standoff by an interlocking feature that allows said tablet receiver to be selectively removed from said standoff.

8. In a split head unit having an electronics housing and a separate tablet, a mounting system configured to mount said tablet to an existing vehicle dash assembly, comprising:
   (a) a bezel having a standard opening configured to receive a conventional aftermarket stereo head unit and an outer bezel perimeter, with said outer bezel perimeter configured to fit tightly within an OEM head unit opening in said existing vehicle dash assembly;
   (b) a head unit emulator bracket, including,
      (i) an outer emulator bracket perimeter, said outer emulator bracket perimeter being configured to fit in said standard opening in said bezel,
      (ii) a right forward-extending portion, said right forward-extending portion having a right side,
      (iii) a left forward-extending portion, said left forward-extending portion having a left side,
      (iv) wherein said left side of said left forward-extending portion is offset a distance from said right side of said right forward-extending portion a distance that is equal to a width of said conventional aftermarket stereo head unit
   (c) a right attachment bracket connected to said right forward-extending portion of said head unit emulator bracket, said right attachment bracket including dash mounting features configured to attach said right attachment bracket to said existing vehicle dash assembly;
   (d) a left attachment bracket connected to said left forward-extending portion of said left head unit emulator bracket, said left attachment bracket including dash mounting features configured to attach said left attachment bracket to said existing vehicle dash assembly;
   (e) a standoff attached to said head unit emulator bracket;
   (e) a tablet receiver attached to said standoff; and
   said tablet receiver being configured to hold said tablet.

9. The mounting system as recited in claim 8, wherein:
   (a) said right forward-extending portion includes a first plurality of holes;
   (b) said right attachment bracket is connected to said right tang forward-extending portion by passing a first plurality of mounting screws through said right attachment bracket and into said first plurality of holes;
   (c) said left forward-extending portion includes a second plurality of holes; and
   (d) said left attachment bracket is connected to said left tang forward-extending portion by passing a second plurality of mounting screws through said left attachment bracket and into said second plurality of holes.

10. The mounting system as recited in claim 9, wherein:
   (a) said head unit emulator bracket includes a plate occupying the same plane as a front face of said conventional aftermarket stereo head unit; and
   (b) said standoff is attached to said plate.

11. The mounting system as recited in claim 8, wherein:
(a) said right attachment bracket includes a set of right attachment bracket upper holes configured for use in the attachment of said electronics housing to said right attachment bracket and
(b) said left attachment bracket includes a set of left attachment bracket upper holes configured for use in the attachment of said electronics housing to said left attachment bracket.

12. The mounting system as recited in claim 8 wherein said standard opening in said bezel is selected from the group consisting of a single DIN opening and a double DIN opening.

13. The mounting system as recited in claim 8, further comprising a capture bezel configured to attach over a front of said tablet and lock into said tablet receiver.

14. The mounting system as recited in claim 8, wherein said tablet receiver is attached to said standoff by an interlocking feature that allows said tablet receiver to be selectively removed from said standoff.

15. A mounting system for mounting a stereo head unit in an existing vehicle dash assembly, comprising:
(a) an electronics housing;
(b) a tablet configured to provide a touch-based user interface for the operation of said electronics housing;
(c) a bezel having a standard opening configured to receive a conventional aftermarket stereo head unit and an outer bezel perimeter, with said outer bezel perimeter configured to fit tightly within an OEM head unit opening in said existing vehicle dash assembly;
(d) a head unit emulator bracket, including,
  (i) an outer emulator bracket perimeter, said outer emulator bracket perimeter being configured to fit in said standard opening in said bezel,
  (ii) a right forward-extending portion, said right forward-extending portion having a right side,
  (iii) a left forward-extending portion, said left forward-extending portion having a left side,
  (iv) wherein said left side of said left forward-extending portion is offset a distance from said right side of said right forward-extending portion a distance that is equal to a width of said conventional aftermarket stereo head unit;
(e) an attachment bracket connected to said head unit emulator bracket, said attachment bracket including dash mounting features configured to attach said attachment bracket to said existing vehicle dash assembly;
(f) a tablet receiver attached to said head unit emulator bracket; and
(g) said tablet receiver being configured to hold said tablet.

16. The mounting system as recited in claim 15, wherein:
(a) said attachment bracket includes a right attachment bracket and a left attachment bracket;
(b) said head unit emulator bracket includes a right forward-extending portion;
(c) said right attachment bracket is connected to said right forward-extending portion;
(d) said head unit emulator bracket includes a left forward-extending portion; and
(e) said left attachment bracket is connected to said left forward-extending portion.

17. The mounting system as recited in claim 16, wherein:
(a) said head unit emulator bracket includes a plate occupying the same plane as a front face of said conventional aftermarket stereo head unit; and
(b) said standoff is attached to said plate.

18. The mounting system as recited in claim 16, wherein:
(a) said right attachment bracket includes a set of right attachment bracket upper holes configured for use in the attachment of said electronics housing to said right attachment bracket and
(b) said left attachment bracket includes a set of left attachment bracket upper holes configured for use in the attachment of said electronics housing to said left attachment bracket.

19. The mounting system as recited in claim 15 wherein said standard opening in said bezel is selected from the group consisting of a single DIN opening and a double DIN opening.

20. The mounting system as recited in claim 15, further comprising a capture bezel configured to attach over a front of said tablet and lock into said tablet receiver.

* * * * *